(12) United States Patent
Fukuhara et al.

(10) Patent No.: US 11,843,366 B2
(45) Date of Patent: Dec. 12, 2023

(54) SURFACE ACOUSTIC WAVE FILTER WITH SUBSET OF VELOCITY ADJUSTED RESONATORS

(71) Applicant: Skyworks Solutions, Inc., Irvine, CA (US)

(72) Inventors: Hironori Fukuhara, Ibaraki (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 274 days.

(21) Appl. No.: 17/120,692

(22) Filed: Dec. 14, 2020

(65) Prior Publication Data

US 2021/0135655 A1    May 6, 2021

Related U.S. Application Data

(63) Continuation of application No. 17/081,573, filed on Oct. 27, 2020.

(60) Provisional application No. 62/928,741, filed on Oct. 31, 2019, provisional application No. 62/928,792, filed on Oct. 31, 2019.

(51) Int. Cl.
*H03H 9/25* (2006.01)
*H03H 9/02* (2006.01)
*H03H 9/64* (2006.01)

(52) U.S. Cl.
CPC .......... *H03H 9/25* (2013.01); *H03H 9/02574* (2013.01); *H03H 9/02834* (2013.01); *H03H 9/6406* (2013.01)

(58) Field of Classification Search
None
See application file for complete search history.

(56) References Cited

U.S. PATENT DOCUMENTS

| 8,294,331 | B2 | 10/2012 | Abbott et al. | |
|---|---|---|---|---|
| 8,741,683 | B2 | 6/2014 | Huang et al. | |
| 10,090,825 | B2 | 10/2018 | Kuroyanagi | |
| 2013/0127565 | A1* | 5/2013 | Nishihara | H03H 9/02102 333/133 |

(Continued)

FOREIGN PATENT DOCUMENTS

WO    WO 2017/161303 A1    9/2017

OTHER PUBLICATIONS

U.S. Appl. No. 17/081573, filed Oct. 27, 2020, Acoustic Wave Device With Velocity Reduction Cover.

(Continued)

*Primary Examiner* — Kenneth B Wells
(74) *Attorney, Agent, or Firm* — Knobbe, Martens, Olson & Bear, LLP

(57) ABSTRACT

An acoustic wave resonator is disclosed. The acoustic wave resonator can include a piezoelectric layer, an interdigital transducer electrode positioned over the piezoelectric layer, a temperature compensation layer positioned over the interdigital transducer electrode, and a velocity reduction cover that extends over at least a portion of a central region of the interdigital transducer electrode and over at least a portion of the temperature compensation layer. The velocity reduction cover is arranged to cause a velocity of an acoustic wave generated by the acoustic wave resonator to be reduced.

20 Claims, 21 Drawing Sheets

(56) References Cited

U.S. PATENT DOCUMENTS

| | | | |
|---|---|---|---|
| 2014/0285287 A1* | 9/2014 | Komatsu | H03H 9/02858 333/195 |
| 2016/0025577 A1* | 1/2016 | Francois | G01K 11/265 374/117 |
| 2016/0261249 A1* | 9/2016 | Takamine | H03H 9/706 |
| 2017/0279433 A1* | 9/2017 | Matsukura | H03H 9/64 |
| 2018/0316332 A1* | 11/2018 | Wu | H03H 1/00 |
| 2019/0074813 A1 | 3/2019 | Zou et al. | |
| 2020/0162052 A1 | 5/2020 | Matsuoka et al. | |
| 2021/0067127 A1 | 3/2021 | Sasaki et al. | |
| 2021/0067134 A1 | 3/2021 | Fujiwara | |
| 2021/0135654 A1 | 5/2021 | Fukuhara et al. | |

OTHER PUBLICATIONS

U.S. Appl. No. 17/120692, filed Dec. 14, 2020, Surface Acoustic Wave Filter With Subset of Velocity Adjusted Resonators.

Nakamura et al., "Suppression Mechanism of Transverse-Mode Spurious Responses in SAW Resonators on a SiO2/Al/LiNbO3 Structure", IEEE International Ultrasonics Symposium Proceedings, 2011.

Mimura et al., "Low Acoustic Velocity Rayleigh SAW Technology for Miniaturization of High Performance TC-SAW Devices," Seventh International Symposium on Acoustic Wave Devices for Future Mobile Communication Systems., 2018.

\* cited by examiner

SURFACE ACOUSTIC WAVE FILTER WITH SUBSET OF VELOCITY ADJUSTED RESONATORS

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave resonator is disclosed. The acoustic wave resonator can include a piezoelectric layer, an interdigital transducer electrode positioned over the piezoelectric layer, a temperature compensation layer positioned over the interdigital transducer electrode, and a velocity reduction cover that extends over at least a portion of a central region of the interdigital transducer electrode and over at least a portion of the temperature compensation layer. The velocity reduction cover is arranged to cause a velocity of an acoustic wave generated by the acoustic wave resonator to be reduced.

In one embodiment, the velocity reduction cover includes first and second edge regions on opposing sides of a central region. The first edge region is positioned over edge portions of the first fingers and the second edge region is positioned over edge portions of the second fingers. The velocity reduction layer being thicker in the first and second edge regions than in the central region.

In one embodiment, the interdigital transducer electrode includes a first bus bar, first fingers extending from the first bus bar, a second bus bar, and second fingers extending from the second bus bar.

In one embodiment, a density of the velocity reduction cover is greater than a density of the temperature compensation layer.

In one embodiment, the temperature compensation layer includes silicon dioxide.

In one embodiment, the interdigital transducer electrode includes molybdenum.

In one embodiment, the interdigital transducer electrode and the velocity reduction cover include the same material.

In one embodiment, the velocity reduction cover includes a conductive material. The velocity reduction cover can be spaced apart from the interdigital transducer electrode by a distance of 40 nanometers or more. The velocity reduction cover can include at least one of tungsten, molybdenum, platinum, gold, iridum, ruthenium, titanium, copper, or tantalum. The velocity reduction cover includes a non-conductive material. The velocity reduction cover is spaced apart from the interdigital transducer electrode by a distance of 40 nanometers or less. The velocity reduction cover includes at least one of tantalum pentoxide, titanium oxide, or titanium nitride.

In one embodiment, the velocity reduction cover includes a first sublayer that extends through at least part of the central portion and the edge portions of the velocity reduction cover and a second sublayer that extends parallel to the first layer and located only within at least one of the first and second edge portions of the velocity reduction cover. The second sublayer can include a first strip within the first edge portion of the velocity reduction cover and extending perpendicular to the fingers of the interdigital transducer electrode and a second strip within the second edge portion of the velocity reduction cover and extending perpendicular to the fingers of the interdigital transducer electrode. The second sublayer can further include a third strip within the first edge portion of the velocity reduction cover and a fourth strip within the second edge portion of the velocity reduction cover. The first sublayer can be patterned to include at least one aperture extending through a portion of the central region of the velocity reduction cover. The first and second sublayers can include the same material. The velocity reduction cover can extend over the temperature compensation layer. A portion of the temperature compensation layer can extend over the velocity reduction cover.

In one embodiment, the piezoelectric layer is a part of a multilayer piezoelectric substrate, the multilayer piezoelectric substrate additionally including a support substrate underlying the piezoelectric layer.

In one aspect, an acoustic wave filter is disclosed. The acoustic wave filter can include a temperature compensation layer. The acoustic wave filter can also include a first acoustic wave resonator that includes a first interdigital transducer electrode and a first velocity reduction cover that extends over at least a portion of a central region of the first interdigital transducer electrode and over at least a portion of the temperature compensation layer. The first velocity reduction cover is arranged to cause a velocity of an acoustic wave generated by the first acoustic wave resonator to be reduced. The acoustic wave filter can further include a second acoustic wave resonator that includes a second interdigital electrode and a second velocity reduction cover that extends over at least a portion of a central region of the second interdigital transducer electrode and over at least a second portion of the temperature compensation layer. The second velocity reduction cover is arranged to cause a velocity of an acoustic wave generated by the second acoustic wave resonator to be reduced. The first and second acoustic wave resonators are included in a plurality of acoustic wave resonators arranged to filter a radio frequency signal.

In one embodiment, density of the first velocity reduction cover is greater than a density of the temperature compensation layer.

In one embodiment, the temperature compensation layer includes silicon dioxide.

In one embodiment, the first and second interdigital transducer electrodes and the first and second velocity reduction covers include the same material.

In one embodiment, the first velocity reduction cover includes a conductive material.

In one embodiment, the first velocity reduction cover includes a non-conductive material.

In one embodiment, the first velocity reduction cover includes at least one of tungsten, molybdenum, platinum, gold, iridium, ruthenium, titanium, copper, tantalum, tantalum pentoxide, titanium oxide, or titanium nitride.

In one embodiment, the first velocity reduction cover includes a first sublayer that extends through at least part of a central portion and edge portions of the first velocity reduction cover and a second sublayer that extends parallel to the first layer and located only within at least one of the first and second edge portions of the first velocity reduction cover. The first and second sublayers can include the same material.

In one embodiment, the first interdigital transducer electrode includes a first bus bar, first fingers that extend from the first bus bar, a second bus bar, and second fingers that extend from the second bus bar. A central region of the first velocity reduction cover can extend over at least a portion of the bus bars of the first interdigital transducer electrode.

In one embodiment, the first interdigital transducer electrode includes a first bus bar, first fingers that extend from the first bus bar, a second bus bar, and second fingers that extend from the second bus bar. The first velocity reduction cover can be configured such that a central region of the first velocity reduction cover does not extend over the bus bars of the first interdigital transducer electrode.

In one embodiment, a surface acoustic wave filter that is configured to filter a radio frequency signal is disclosed. The surface acoustic wave filter can include a first surface acoustic wave device that includes an interdigital transducer electrode, a first portion of a temperature compensation layer, and a velocity reduction cover that is spaced apart from the interdigital transducer electrode by at least a portion of the first portion of the temperature compensation layer. A density of the velocity reduction cover is higher than a density of the temperature compensation layer. The surface acoustic wave filter can also include a second surface acoustic wave device that includes a second portion of the temperature compensation layer. The second portion of the temperature compensation layer is free from any velocity reduction cover that has a higher density than the density of the temperature compensation layer.

In one embodiment, the second surface acoustic wave device is a multi-mode surface acoustic wave filter. The multi-mode surface acoustic wave filter and the first surface acoustic wave resonator device can be implemented on a single die.

In one embodiment, the velocity reduction cover includes first and second edge regions on either side of a central region, the velocity reduction cover thicker in the first and second edge regions than in the central region. The interdigital transducer electrode can include a bus bar and fingers that extend from the bus bar. The first and second edge regions can extend generally perpendicular to the fingers of the interdigital transducer electrode. The velocity reduction cover layer can include a first sublayer that extends through at least part of the central portion and the edge portions of the velocity reduction cover, and a second sublayer that extends parallel to the first layer and located only within at least one of the first and second edge portions of the velocity reduction cover. The second sublayer can include a first strip within the first edge portion of the velocity reduction cover and extending perpendicular to the fingers of the interdigital transducer electrode, and a second strip within the second edge portion of the velocity reduction cover and extending perpendicular to the fingers of the interdigital transducer electrode.

In one embodiment, the interdigital transducer electrode and the velocity reduction cover include the same material.

In one embodiment, the velocity reduction cover can include a conductive material. The velocity reduction cover can be spaced apart from the interdigital transducer electrode by a distance of 40 nanometers or more. The velocity reduction cover can include at least one of tungsten, molybdenum, platinum, gold, iridium, ruthenium, titanium, copper, or tantalum. The velocity reduction cover can include a non-conductive material. The velocity reduction cover can be spaced apart from the interdigital transducer electrode by a distance of 40 nanometers or less. The velocity reduction cover can include at least one of tantalum pentoxide, titanium oxide, or titanium nitride.

In one embodiment, the surface acoustic wave filter further includes a third surface acoustic wave device. The third surface acoustic wave device can include a second interdigital transducer electrode and a second velocity reduction cover that are spaced apart from one another by at least a portion of the temperature compensation layer. A density of the second velocity reduction cover cam be higher than a density of the temperature compensation layer.

In one embodiment, the first and second surface acoustic wave devices include a multilayer piezoelectric substrate. The multilayer piezoelectric substrate can include a support substrate and a piezoelectric layer between the support substrate and the interdigital transducer electrode of the first surface acoustic wave device.

In one aspect, a surface acoustic wave filter is disclosed. The surface acoustic wave filter can include a velocity-adjusted resonator that includes an interdigital transducer electrode, a temperature compensation layer, and a velocity reduction cover spaced apart from the interdigital transducer electrode by at least a portion of the temperature compensation layer. The velocity reduction cover includes first and second edge regions on either side of a central region and being thicker in the first and second edge regions than in the central region. The surface acoustic wave filter can also include one or more surface acoustic wave devices coupled to the velocity-adjusted resonator. The one or more surface acoustic wave devices and the velocity adjusted resonator together are arranged to filter a radio frequency signal.

In one embodiment, a density of the velocity reduction cover is higher than a density of the temperature compensation layer.

In one embodiment, the interdigital transducer electrode includes a bus bar and fingers that extend from the bus bar. The first and second edge regions can extend generally perpendicular to the fingers of the interdigital transducer electrode.

In one embodiment, the temperature compensation layer includes silicon dioxide.

In one embodiment, the interdigital transducer electrode and the velocity reduction cover include the same material.

In one embodiment, the velocity reduction cover includes a conductive material.

In one embodiment, the velocity reduction cover includes a non-conductive material.

In one embodiment, the velocity reduction cover includes at least one of tungsten, molybdenum, platinum, gold, iridium, ruthenium, titanium, copper, tantalum, tantalum pentoxide, titanium oxide, or titanium nitride.

In one embodiment, the velocity reduction cover includes a first sublayer extending through at least part of the central portion and the edge portions of the velocity reduction cover, and a second sublayer extending parallel to the first layer and located only within at least one of the first and second edge portions of the velocity reduction cover. The second sublayer can include a first strip within the first edge portion of the velocity reduction cover and extending perpendicular to fingers of the interdigital transducer electrode, and a second strip within the second edge portion of the velocity reduction cover and extending perpendicular to the fingers of the interdigital transducer electrode.

In one embodiment, the one or more surface acoustic wave devices further includes a second velocity-adjusted resonator, the second velocity-adjusted resonator including a second interdigital transducer electrode and a second velocity reduction cover spaced apart from one another by at least a portion of the temperature compensation layer. A density of the second velocity reduction cover can be higher than a density of the temperature compensation layer.

In one embodiment, each of the one or more surface acoustic wave devices is a velocity-adjusted resonator including an interdigital transducer electrode and a velocity reduction cover spaced apart from one another by at least a portion of a temperature compensation layer. A density of the velocity reduction cover can be higher than a density of the temperature compensation layer.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
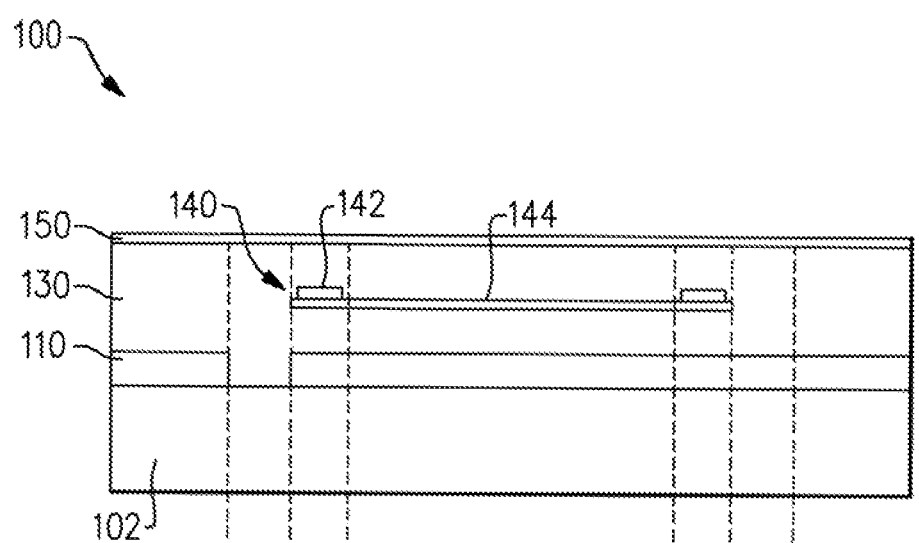
FIG. 1A illustrates a cross-section of a surface acoustic wave (SAW) resonator including a velocity reduction cover having a thicker edge region.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) resonators. The speed at which an acoustic wave will propagate within a SAW resonator is a function of a variety of factors, including the thicknesses of the various components and the density of the materials used to form the various components.

A plurality of resonators may be formed on a single wafer, including filter components of different types. For example, a single wafer may include one or more multi-mode SAW filters, in addition to one or more SAW resonators. These components may have different design, but may share common manufacturing steps, and may therefore share common constituent layers. The use of thicker layers and/or denser materials in an interdigital transducer (IDT) electrode of a SAW resonator can slow the propagation of acoustic waves within the SAW resonators, allowing the SAW resonators to be made more compact. However, the use of these thicker layers or denser materials in IDT electrodes may not be suitable for use in the longitudinally coupled multi-mode SAW filters, such as double mode SAW filters or coupled resonator filters.

Aspects of this disclosure relate to the use of a velocity reduction cover which has increased thickness or density in at least a portion of an edge region of the velocity reduction cover. At least a portion of the velocity reduction cover may be spaced apart from an underlying interdigital transducer electrode by at least a portion of a temperature compensation layer. Because the velocity reduction cover is a distinct component, and because the IDT electrode can be unmodified, the velocity reduction cover may be selectively included in a subset of a plurality of filter components on a single wafer.

Figure 1B:
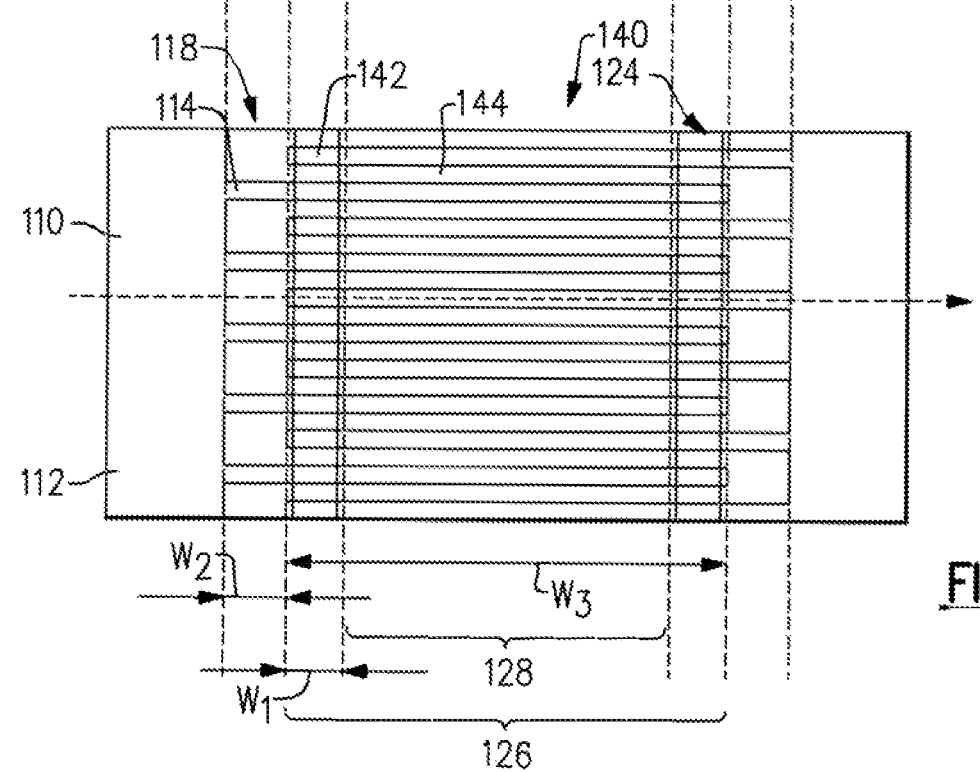
FIG. 1B is a top plan view of the surface acoustic wave resonator of FIG. 1A.

FIG. 1A illustrates a cross-section of a surface acoustic wave (SAW) resonator including a velocity reduction cover having a thicker edge region. FIG. 1B is a top plan view of the surface acoustic wave resonator of FIG. 1A. The illustrated SAW resonator 100 in includes a piezoelectric layer 102. In some embodiments, the piezoelectric layer 102 may include a material such as lithium tantalate (LT) or lithium niobate (LN), although other suitable materials may also be used.

The SAW resonator 100 also includes an interdigital transducer (IDT) electrode 110. The IDT electrode 110 can include any suitable IDT electrode material. In the illustrated embodiment, the IDT electrode 110 includes a single layer, although as discussed elsewhere herein, other embodiments of IDT electrodes can include multiple sublayers. In some embodiments, the IDT electrode 110 can include a layer of Aluminum (Al) copper (Cu), Magnesium (Mg), tungsten (W), titanium (Ti), or other suitable materials, as well as any suitable combination thereof. In some embodiments, the IDT electrode 110 may include alloys, such as AlMgCu, AlCu, etc.

A temperature compensation layer 130 is located over the IDT electrode 110. In some embodiments, the temperature compensation layer 130 may include a layer of silicon dioxide (SiO2) or other silica oxide-based material, although other suitable materials may also be used. In the SAW resonator 100 the temperature compensation layer 130 can bring a temperature coefficient of frequency (TCF) of the SAW resonator 100 closer to zero. The temperature compensation layer 130 can have a positive TCF. This can compensate for a negative TCF of the piezoelectric layer 102, as various piezoelectric layers such as lithium niobate and lithium tantalate have a negative TCF. A passivation layer 150 is located over the temperature compensation layer 130. The passivation layer 150 may include, for example, a layer of silicon nitride (SiN) or a layer of silicon oxynitride (SiON), although other suitable materials may also be used.

In addition, the SAW resonator 100 includes a velocity adjustment structure which is configured to alter the speed at which an acoustic wave propagates along the SAW resonator. In the embodiment of FIG. 1A, the velocity adjustment structure includes a velocity reduction cover 140 which is located over the IDT electrode 110. A portion of the temperature compensation layer 130 is located between the velocity reduction cover 140 and the IDT electrode 110.

In the illustrated embodiment, the velocity adjustment structure includes a velocity reduction cover 140 which includes a first sublayer 144 and a second sublayer in the form of strips 142 located within edge regions of the velocity reduction cover 140. In the illustrated embodiment, the strips 142 of the second sublayer overlie the first sublayer 144. The velocity reduction cover 140 is thicker in its edge regions than in a central region of the velocity reduction cover 140.

The velocity reduction cover 140 includes a material which is denser than the temperature compensation layer 130, such that an acoustic wave will propagate through the velocity reduction cover 140 at a slower velocity than through the temperature compensation layer 130. Suitable materials which may be used in velocity reduction cover 140 include, but are not limited to, molybdenum (Mo), tungsten (W), platinum (Pt), gold (Au), silver (Ag), iridium (Ir), ruthenium (Ru), titanium (Ti), copper (Cu), tantalum (Ta), tantalum pentoxide ($Ta_2O_5$), titanium oxide (TiO), and titanium nitride (TiN).

As can be seen in FIG. 1B, the IDT electrode 110 can include a bus bar 112 and fingers 114 that extend from the bus bar 112 toward the opposite bus bar, with a gap portion 118 located between the ends of the fingers 114 and the opposite bus bar. The gap portions 118 can have a width $W_2$. In some embodiments the gap portions 118 may have a width of about 0.9λ, although other suitable widths may also be used. The fingers 114 of the IDT electrode 110 have an active region. The active region can be a region between the gap portions 118. This region can be referred to as an aperture 126, having a width $W_3$. In the illustrated embodiment, the width $W_3$ of the aperture 126 corresponds to the width of the velocity reduction cover 140. The edge portions 124 on either side of the central region 128 of the velocity reduction cover 140 have widths $W_1$. In some embodiments the edge portions 124 may have a width of about 0.5λ to 1.5λ, although other suitable widths may also be used. The edge portions 124 can overlie edge portions of fingers 114 of the IDT electrode 110 as illustrated.

Figure 1C:
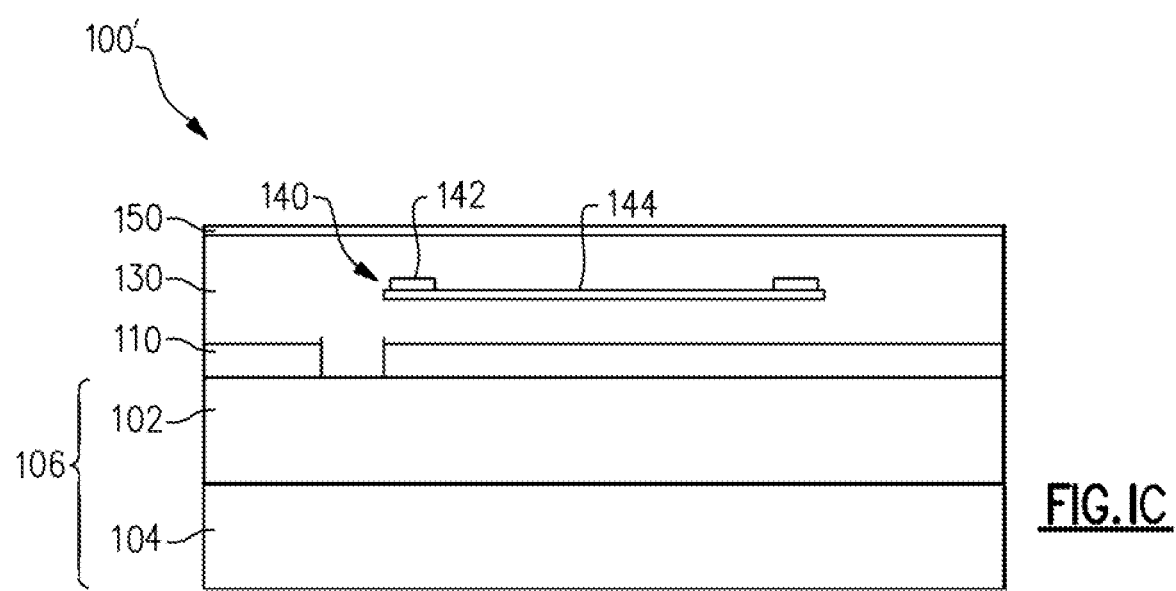
FIG. 1C illustrates a cross-section of a surface acoustic wave (SAW) resonator including a multi-layer piezoelectric substrate and a velocity reduction cover.

FIG. 1C illustrates a cross-section of a surface acoustic wave resonator including a multi-layer piezoelectric substrate and a velocity reduction cover. The SAW resonator 100' of FIG. 1C is similar to the SAW resonator 100 of FIG. 1A, except that the SAW resonator 100' includes a multi-layer piezoelectric substrate 106, including a support substrate 104 in addition to the piezoelectric layer 102. The support substrate 104 may include silicon (Si) in some embodiments, although other suitable materials may also be used, including but not limited to sapphire, aluminum oxide ($Al_2O_3$), aluminum nitride (AlN), or ceramic materials. Although the multilayer piezoelectric substrate 106 is illustrated as including two layers, one or more additional layers may also be included. For example, in some embodiments, the multilayer piezoelectric substrate may include a functional layer, such as an $SiO_2$ layer, between the piezoelectric layer 102 and the support substrate 104. A multi-layer piezoelectric substrate can be implemented in accordance with any suitable principles and advantages of the velocity reduction covers disclosed herein.

Figure 2A:
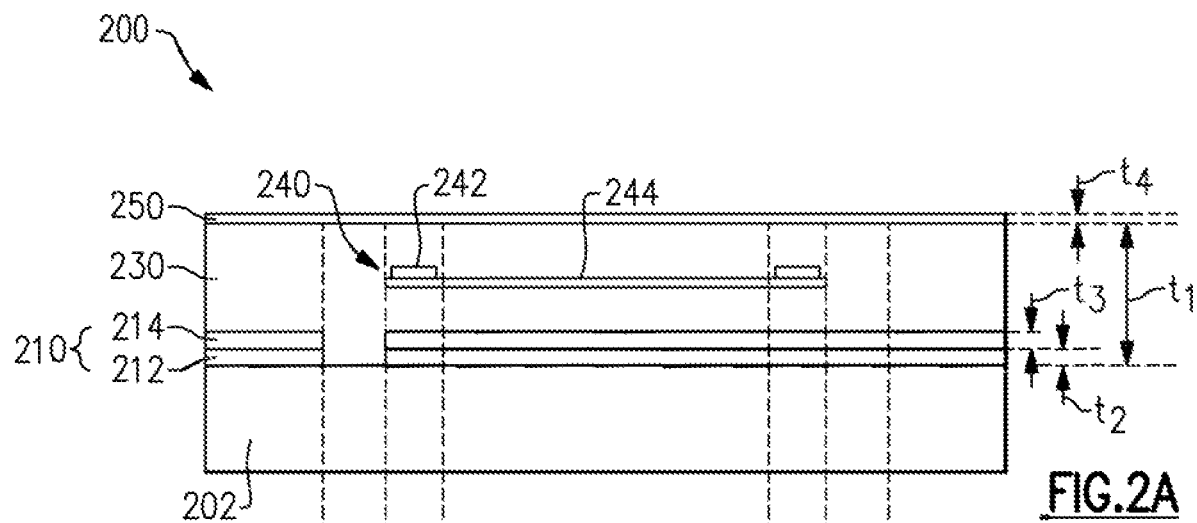
FIG. 2A illustrates a cross-section of another embodiment of a surface acoustic wave resonator including a velocity reduction cover and a multilayer interdigital transducer electrode.
Figure 2B:
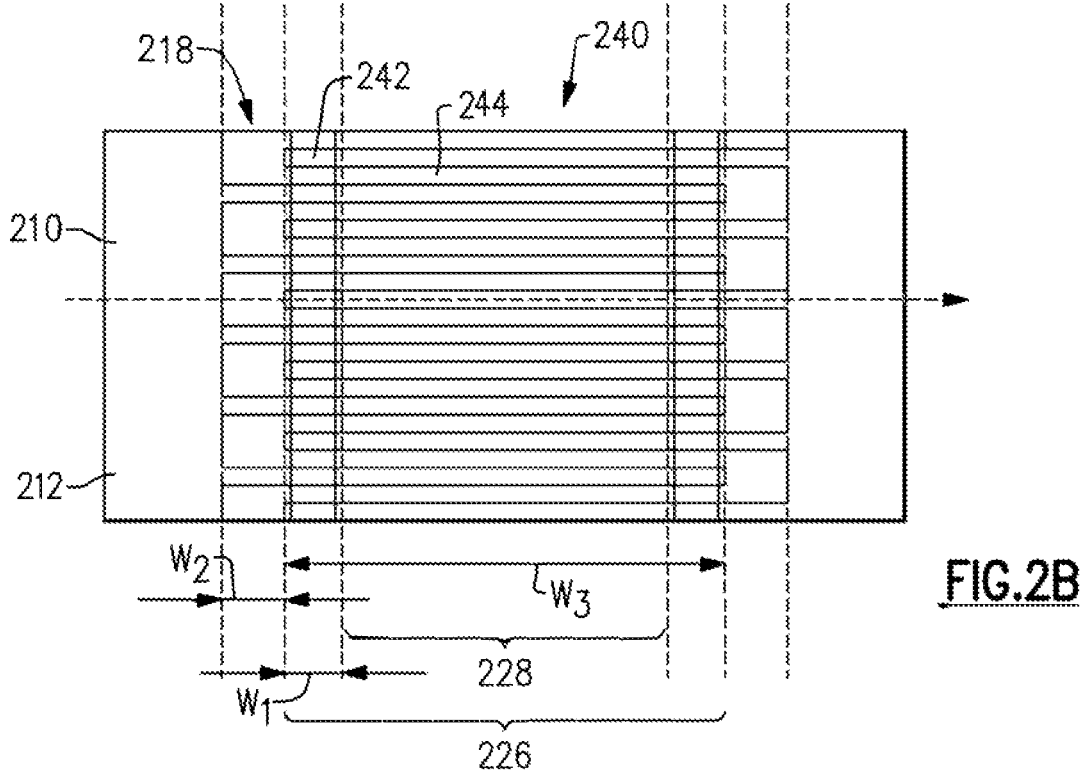
FIG. 2B is a top plan view of the surface acoustic wave resonator of FIG. 2A.

FIG. 2A illustrates a cross-section of another embodiment of a surface acoustic wave resonator 200 including a velocity reduction cover 240 and a multilayer interdigital transducer electrode 210. FIG. 2B is a top plan view of the surface acoustic wave resonator of FIG. 2A. The SAW resonator 200 is similar in structure to the SAW resonator 100 of FIGS. 1λ and 1B, except that the IDT electrode 210 includes a first IDT sublayer 212 and a second IDT sublayer 214. The surface acoustic wave resonator 200 can also include a velocity adjustment structure that has a velocity reduction cover 240. The velocity reduction cover 240 can include a first sublayer 244 and a second sublayer 242. The second sublayer 242 can be located within edge regions of the velocity reduction cover 240. The second sublayer 242 can be positioned over the first sublayer 244. In the illustrated embodiment, the first IDT sublayer 212 sublayer has a thickness $T_2$, the second IDT sublayer 214 has a thickness $T_3$, and the passivation layer 250 has a thickness of $T_1$ within the gap regions 218. The passivation layer 250 has a thickness of $T_4$.

In some embodiments, the first IDT sublayer 212 may include molybdenum, and the thickness $T_2$ may be between about 0.02λ and 0.1λ, although other material and other thicknesses may also be used. In some embodiments, the second IDT sublayer 214 may include aluminum, and the thickness $T_3$ may be between about 0.02λ and 0.1λ, although other materials and thicknesses may also be used. In some embodiments, the temperature compensation layer 230 may include an $SiO_2$ layer, and the thickness $T_1$ of the temperature compensation layer 230 may be between about 0.2λ and 0.5λ, although other materials and other thicknesses may also be used. In some embodiments, the passivation layer 250 may include a silicon nitride (SiN) layer, and the thickness $T_4$ of the passivation layer 250 may be less than about 0.2λ, although other materials and other thicknesses may also be used.

Figure 2C:
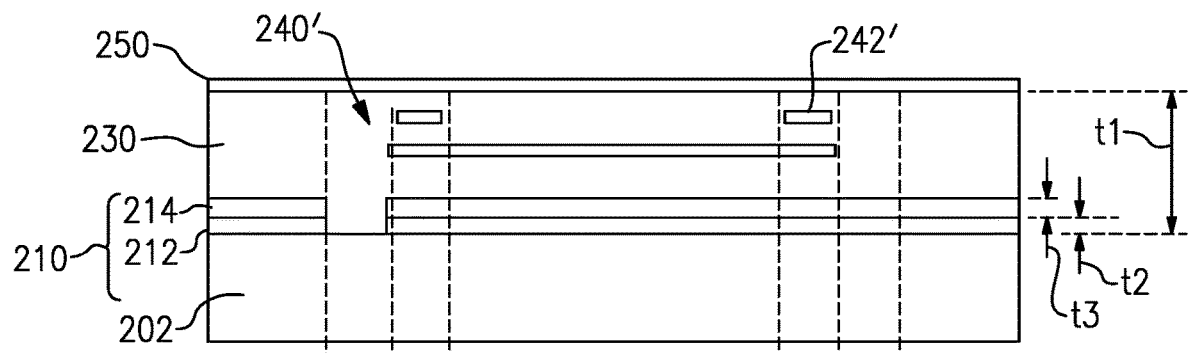
FIG. 2C illustrates a cross-section of another embodiment of a surface acoustic wave resonator.
Figure 2D:
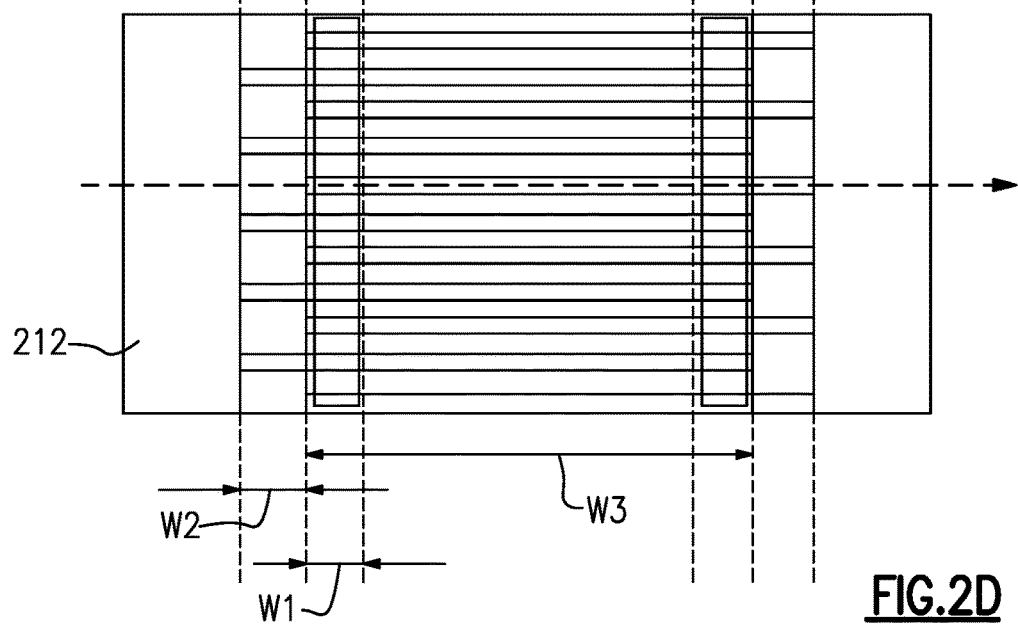
FIG. 2D is a top plan view of the surface acoustic wave resonator of FIG. 2C.

FIG. 2C illustrates a cross-section of another embodiment of a surface acoustic wave resonator 260. The surface acoustic wave resonator 260 can include a piezoelectric layer 202, a multilayer interdigital transducer electrode 210, a temperature compensation layer 230, a velocity reduction cover 240', and a passivation layer 250. FIG. 2D is a top plan view of the surface acoustic wave resonator 260 of FIG. 2C. Unless otherwise noted, components of the surface acoustic wave resonator 260 may be the same or generally similar to like components of any surface acoustic wave resonator disclosed herein. The velocity reduction cover 240' can include a first sublayer 244 and a second sublayer 242'. The second sublayer 242' can be located within edge regions of the velocity reduction cover 240'. The second sublayer 242' can be positioned over the first sublayer 244. The second sublayer 242' can be spaced apart from the first sublayer 244, and at least a portion of the temperature compensation layer 230 can be disposed between the first sublayer 244 and the second sublayer 242'. The first IDT sublayer 212 sublayer has a thickness $T_2$. The second IDT sublayer 214 has a thickness $T_3$. The passivation layer 250 has a thickness of $T_1$ within the gap regions 218. The passivation layer 250 has a thickness of $T_4$.

In some embodiments, the first IDT sublayer 212 may include molybdenum, and the thickness $T_2$ may be between about 0.02λ and 0.1λ, although other material and other thicknesses may also be used. In some embodiments, the second IDT sublayer 214 may include aluminum, and the thickness $T_3$ may be between about 0.02λ and 0.1λ, although other materials and thicknesses may also be used. In some embodiments, the temperature compensation layer 230 may include an $SiO_2$ layer, and the thickness $T_1$ of the temperature compensation layer 230 may be between about 0.2λ and 0.5λ, although other materials and other thicknesses may also be used. In some embodiments, the passivation layer 250 may include a silicon nitride (SiN) layer, and the thickness $T_4$ of the passivation layer 250 may be less than about 0.2λ, although other materials and other thicknesses may also be used.

Figure 3:
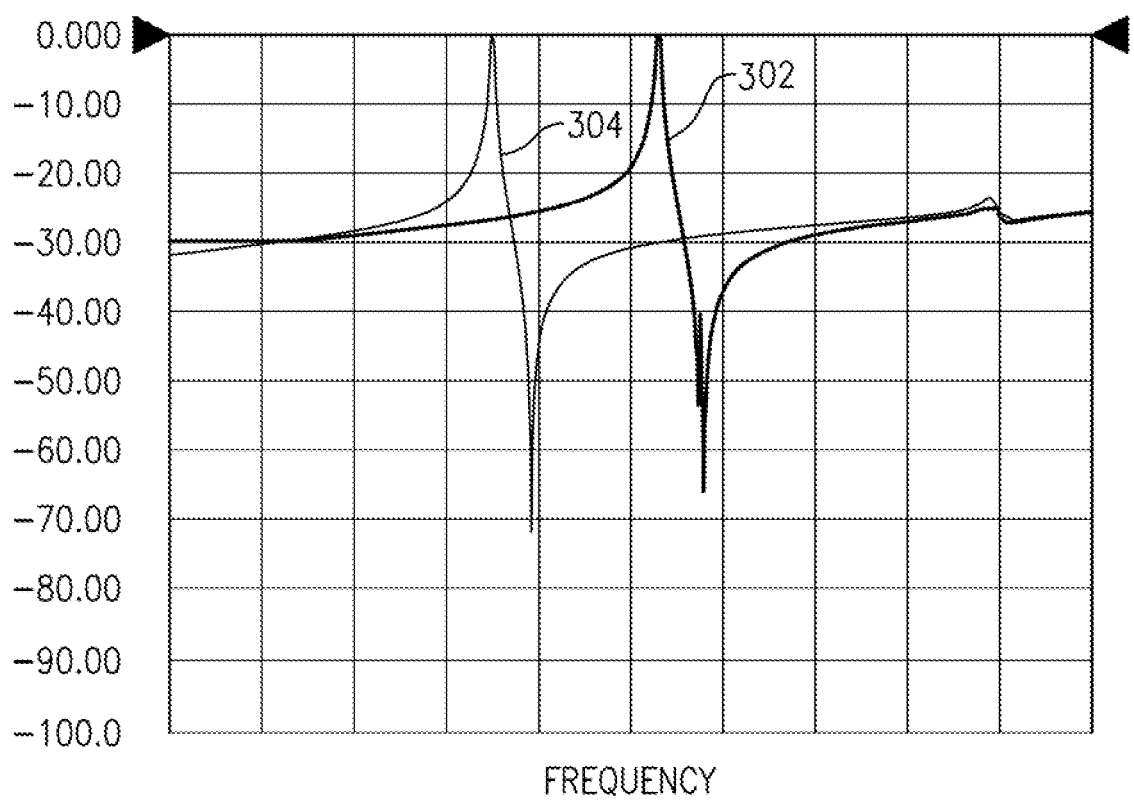
FIG. 3 is a plot illustrating the effect of the inclusion of a velocity reduction cover on the frequency response of a surface acoustic wave device.

FIG. 3 is a plot illustrating the effect of the inclusion of a velocity reduction cover on the frequency response of a surface acoustic wave filter. Curve 302 illustrates the frequency response of an example SAW resonator. Curve 304 illustrates the frequency response of the example SAW resonator with a velocity reduction cover such as the velocity reduction cover of FIGS. 1A and 2A. The frequency response of the SAW resonator has been slowed down by the inclusion of the velocity reduction cover.

By slowing down the propagation of acoustic waves within a SAW resonator, a SAW resonator can be made with a smaller footprint in comparison to a SAW resonator without a high density IDT electrode or other velocity reduction component. This can allow the formation of additional resonators within a given area, or the formation of a smaller package providing functionally equivalent SAW resonators. However, not all embodiments of surface acoustic wave components are suitable for use with a velocity reduction cover or similar structure.

Figure 4:
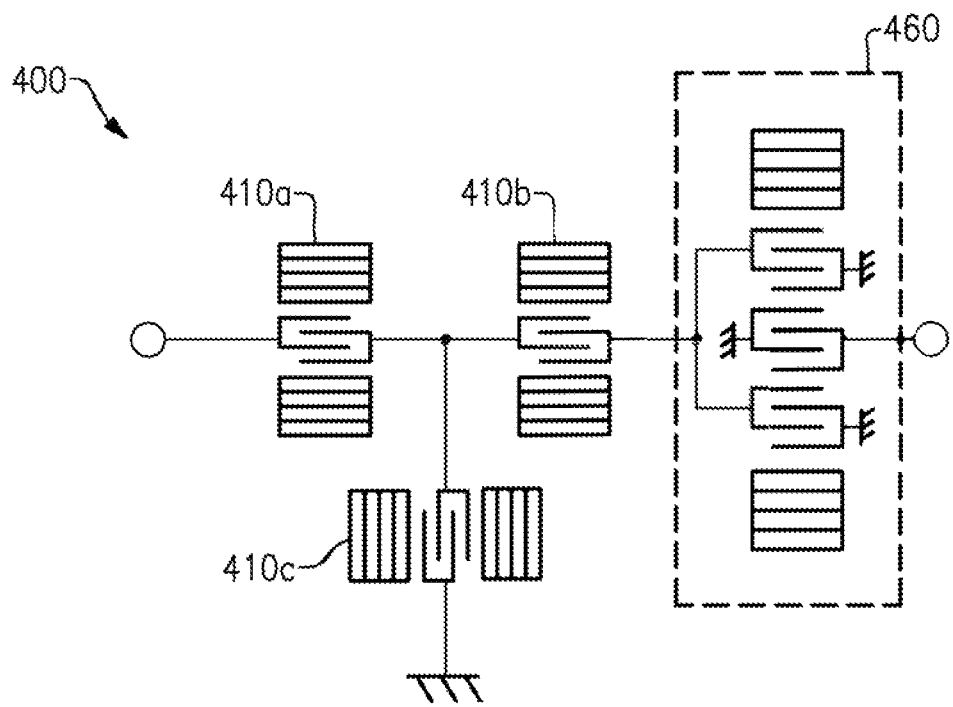
FIG. 4 is a top plan view of a surface acoustic wave filter including a multi-mode surface acoustic wave filter, each of the components of the filter including a high-density interdigital transducer electrode.

FIG. 4 is a top plan view of a surface acoustic wave filter including a multi-mode surface acoustic wave filter. The filter 400 includes three SAW resonators 410a, 410b, and 410c, as well as a multi-mode surface acoustic wave filter 460, referred to herein as an MMS filter 460. Although schematically illustrated as being shorter in length than the MMS filter 460, the SAW resonators 410a, 410b, and 410c may in some embodiments be substantially longer in length than the MMS filter 460, such that a reduction in length of the SAW resonators 410a, 410b, and 410c can have a significant impact on the overall wafer area occupied by the components of filter 400.

The MMS filter 460 is a type of an acoustic wave filter. The MMS filter 460 includes a plurality of IDT electrodes that are longitudinally coupled to each other and positioned between acoustic reflectors. Some MMS filters are referred to as double mode surface acoustic wave (DMS) filters. There may be more than two modes of such DMS filters and/or for other MMS filters. MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection. In certain applications, MMS filters can be receive filters arranged to filter radio frequency signals. The MMS filter 460 can be included in a receive filter that also includes a plurality of acoustic resonators arranged in a ladder topology, for example, as shown in FIG. 4. The MMS filter 460 can be temperature compensated by including a temperature compensation layer, such as a silicon dioxide layer, over IDT electrodes. Such a temperature compensation layer can cause a temperature coefficient of frequency (TCF) of the MMS filter 460 to be closer to zero. In some instances, the MMS filter 460 can include a multi-layer piezoelectric substrate.

Each of the components of the filter 400 can include a high-density interdigital transducer electrode. Due to the reduced footprint of the filter components, particularly the SAW resonators 410a, 410b, and 410c, the overall size of the wafer occupied by the filter components may be reduced. However, the use of a denser IDT electrode in the MMS filter 460 can alter the frequency response of the MMS filter 460.

Figure 5:
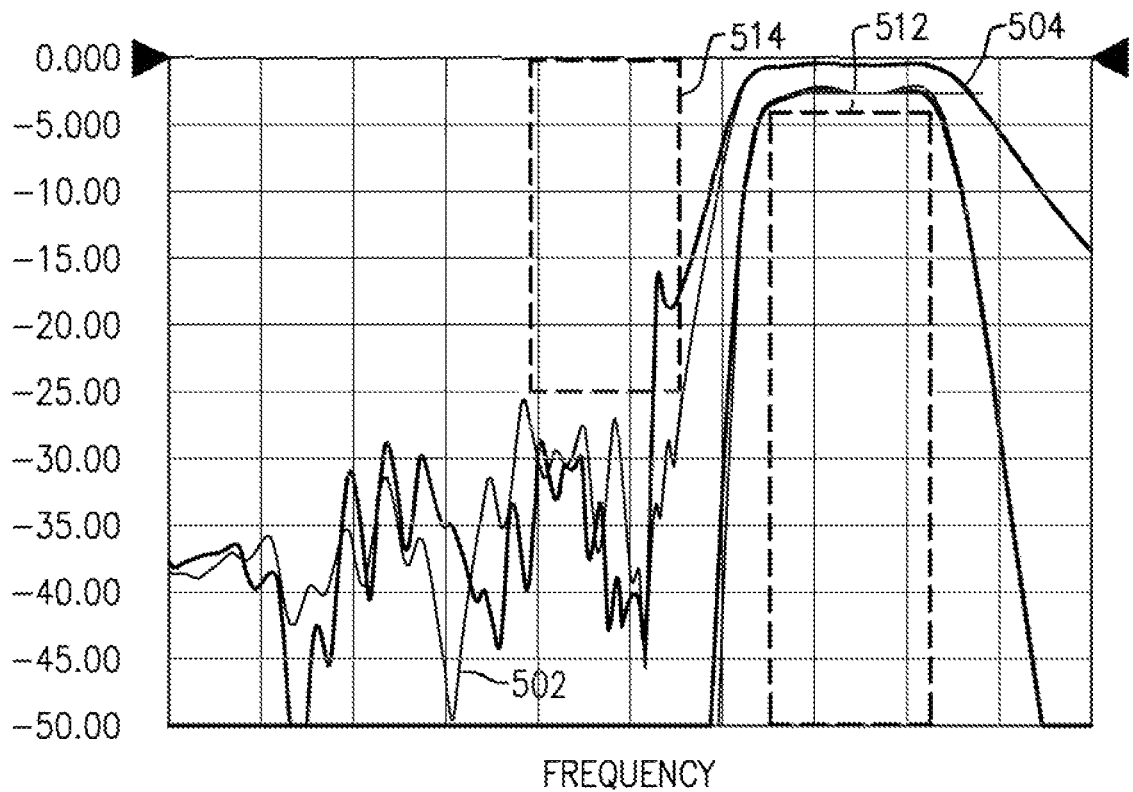
FIG. 5 is a plot of the response of the surface acoustic wave filter of FIG. 4, illustrating the effect of the high-density interdigital transducer electrode on the performance of the filter.

FIG. 5 is a plot of the response of the surface acoustic wave filter 400 of FIG. 4, illustrating the effect of the high-density interdigital transducer electrode on the performance of the filter 400. Regions 512 and 514 of the plot illustrate desired boundaries for the frequency response, illustrating the desired attenuation. Response 502 is a filter response in which a multi-mode surface acoustic wave (MMS) filter such as the MMS filter 560 does not include a high density IDT electrode. The response 502 achieves the desired attenuation illustrated by the gap between regions 512 and 514. Response 504 is a filter response in which a MMS filter such as the MMS filter 460 includes a high density IDT electrode. The use of such a high density IDT electrode in the MMS filter increases the reflection coefficient of the MMS filter 460. In the plot of FIG. 5, t the response 504 does not achieve the desired attenuation, as the response extends into the region defined by boundary 514. The substitution of a high density IDT electrode for a lower density IDT electrodes is not a suitable solution for all filter designs.

In contrast, a velocity adjustment structure such as a velocity reduction cover can be independent from the design of an IDT electrode. The use of an independent velocity adjustment structure allows all of the resonator structures on a single wafer to be formed using shared manufacturing processes, while selectively including velocity adjustment structures in only a subset of the resonator components. In certain embodiments, a SAW filter can include one or more SAW resonators with respective velocity adjustment covers and one or more other SAW devices, such as an MMS filter, that is free from a velocity adjustment cover.

Figure 6A:
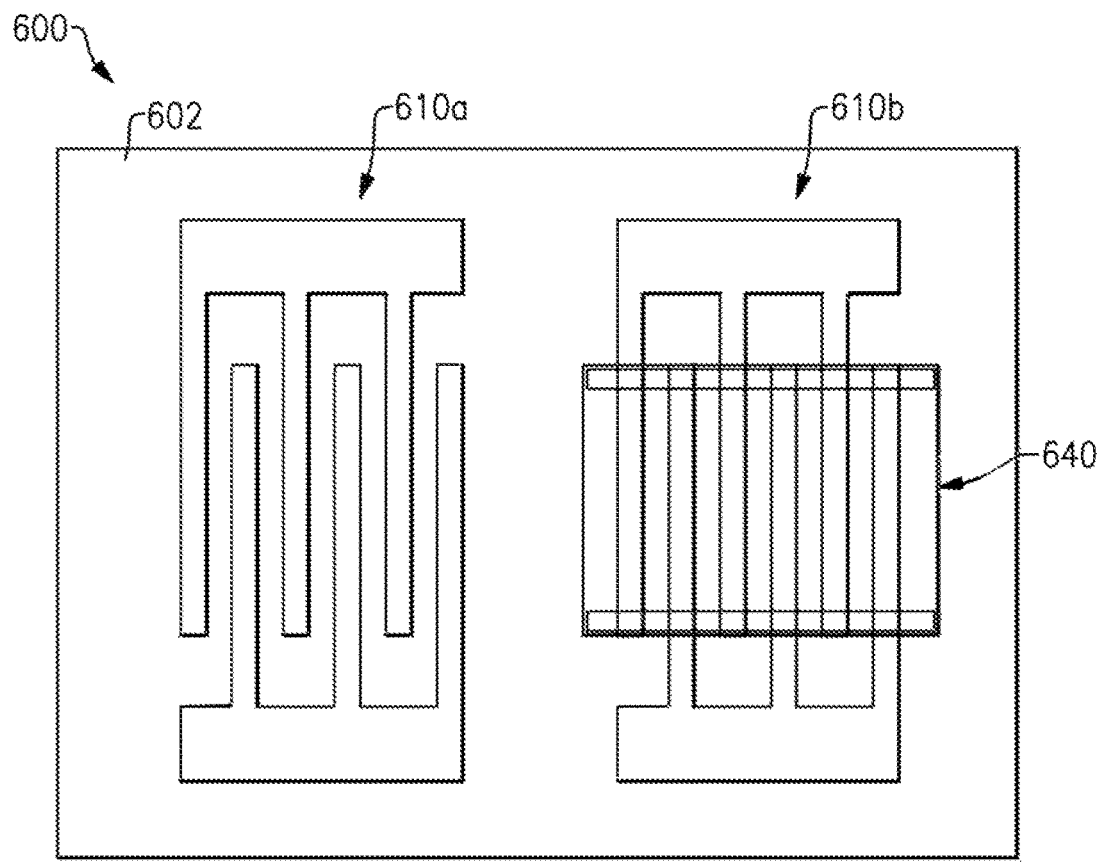
FIG. 6A is a top plan view of multiple surface acoustic wave resonators disposed on a single substrate, a subset of the surface acoustic wave resonators include a velocity reduction cover.
Figure 6B:
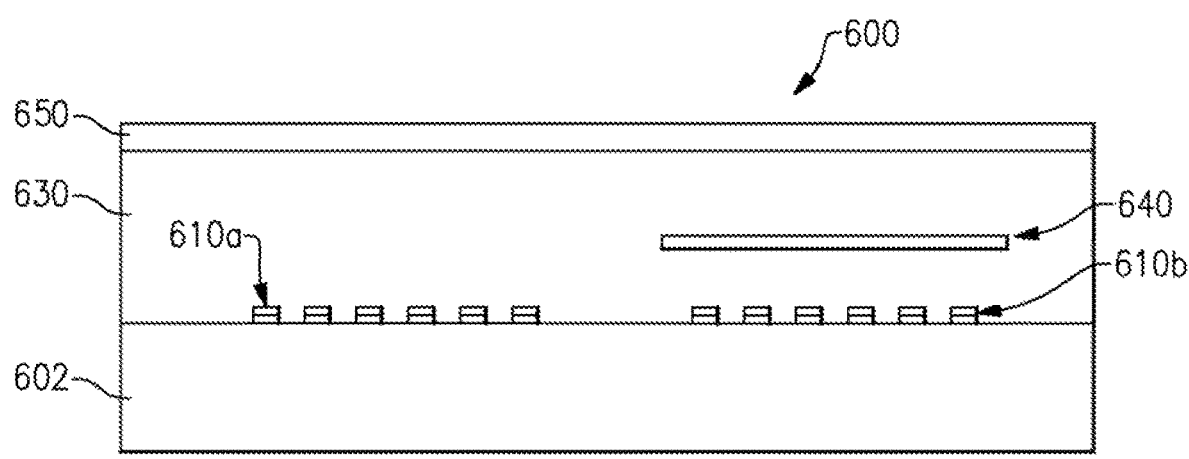
FIG. 6B illustrates a cross-section of the surface acoustic wave resonators of FIG. 6A.

FIG. 6A is a top plan view of two surface acoustic wave resonators disposed on a single wafer, in which only one of the surface acoustic wave resonators includes a velocity reduction cover. FIG. 6B illustrates a cross-section of the wafer of FIG. 6A along the dashed line shown in FIG. 6A.

The structure 600 includes a single wafer 602 supporting a first SAW resonator 610a and a second SAW resonator 610b. The first SAW resonator 610a does not include a velocity reduction cover, while the second SAW resonator 610b includes a velocity reduction cover 640 located over the active area of the second SAW resonator 610b.

In FIG. 6B, the first SAW resonator 610a includes a multilayer IDT electrode which is covered by a temperature compensation layer 630 and a passivation layer 650. The second SAW resonator 610b includes a velocity reduction cover 640 which is located over a multilayer IDT electrode, the velocity reduction cover 640 located within the temperature compensation layer 630. Because the cross-section of FIG. 6B is taken along a line passing through the thinner central region of the velocity reduction cover 640, the thicker edge regions of the velocity reduction cover 640 are not visible in the illustrated cross section.

Figure 7:
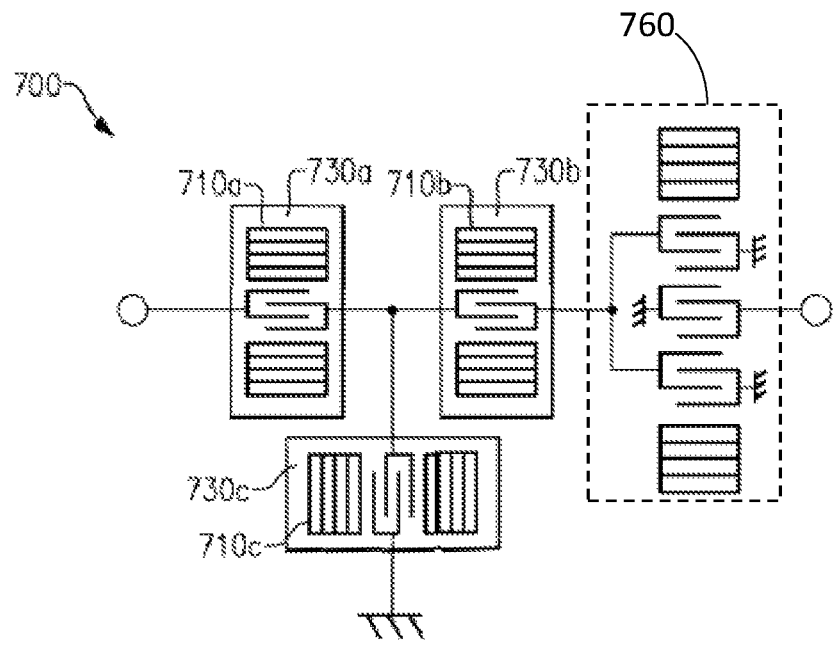
FIG. 7 is a top plan view of a surface acoustic wave filter, a subset of the filter components including a velocity reduction cover.

FIG. 7 is a top plan view of a surface acoustic wave filter 700, a subset of the filter components including a velocity reduction cover. Like the filter 400 of FIG. 4, the filter 700 includes a multi-mode surface acoustic wave (MMS) filter 760, as well as three SAW resonators 710a, 710b, and 710c. In contrast to the filter 400 of FIG. 4, the three SAW resonators 710a, 710b, and 710c each include respective velocity reduction covers 730a, 730b, and 730c. The filter 700, through the use of the velocity reduction covers 730a, 730b, and 730c separate from the IDT electrodes of the SAW resonators 710a, 710b, and 710c and the MMS filter 760, can include SAW resonators 710a, 710b, and 710c without impacting the performance of the MMS filter 760. Because the IDT electrode composition can be common to all of the components of the filter 700, including both the SAW resonators 710a, 710b, and 710c and the MMS filter 760, these components can be efficiently manufactured using multiple shared manufacturing steps.

In some other embodiments, not all of the SAW resonators 710a, 710b, and 710c of the filter 700 may include a velocity reduction cover. In certain embodiments, at least some of the velocity reduction covers 730a, 730b, and 730c may have a first design, while one or more other of the velocity reduction covers 730*a*, 730*b*, and 730*c* may have a different design, such as one of the various designs described herein. In addition, not all of the components on a single wafer need to form part of a single filter. The components of a filter may be distributed across multiple wafers, and components of multiple distinct filters may be formed on a single wafer.

Figure 8:
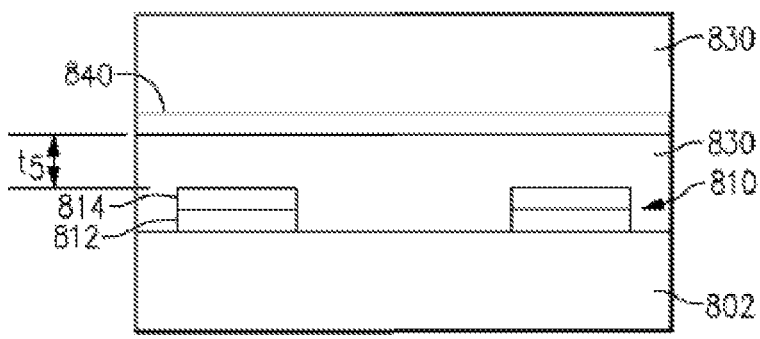
FIG. 8 illustrates a cross-section of a surface acoustic wave resonator including a conductive velocity reduction cover.

In some embodiments, additional design considerations may be taken into account in the design of a SAW resonator including a velocity reduction cover. FIG. 8 illustrates a cross-section of a surface acoustic wave resonator with a velocity reduction cover including a conductive material. The velocity reduction cover 840 is separated from the upper sublayer 814 of the underlying IDT electrode 810 by a portion of the temperature compensation layer 830 having a thickness $T_5$. If the distance $T_5$ between the conductive velocity reduction cover 840 and the IDT electrode 810 is too small, parasitic capacitance may be induced between the conductive velocity reduction cover 840 and the IDT electrode 710 during operation of the SAW resonator, which can impact the performance of the SAW resonator.

Figure 9:
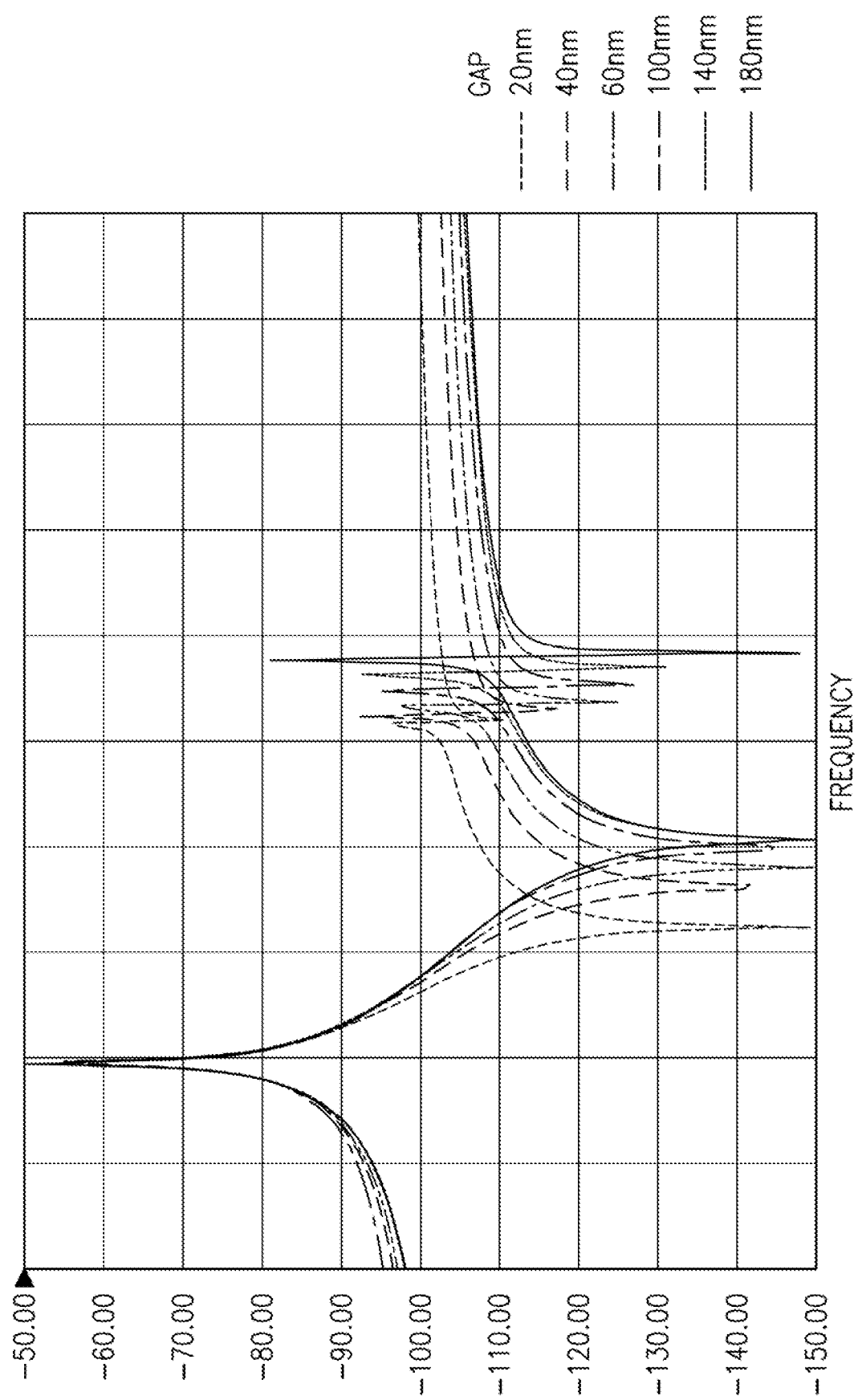
FIG. 9 is a plot illustrating the effect of variation of the gap height between a conductive velocity reduction cover and an interdigital transducer electrode in a surface acoustic wave resonator such as the surface acoustic wave resonator of FIG. 8.

FIG. 9 is a plot illustrating the effect of variation of the gap height between a conductive velocity reduction cover and an interdigital transducer electrode in a surface acoustic wave resonator, such as the surface acoustic wave resonator of FIG. 8. In some embodiments, the gap size may be greater than 40 nm to reduce and/or minimize the impact of parasitic capacitance on the response of the SAW resonator, as the frequency response can be significantly impacted by a gap size of 20 nm compared to a gap size of 40 nm. The additional impact of further gap size increases on the frequency response of the SAW resonator is less significant than the increase to a gap size of at least 40 nm. In contrast, if a nonconductive material is used in the velocity reduction cover, parasitic capacitance between the velocity reduction cover and the IDT electrodes will not occur.

With reference to FIGS. 10 to 18C various velocity reduction covers will be described. Any suitable combination of features of the velocity reduction covers disclosed herein can be implemented together with each other in a velocity reduction cover. Moreover, a filter can include SAW resonators with two or more different velocity reduction covers in accordance with any suitable principles and advantages disclosed herein.

Figure 10:
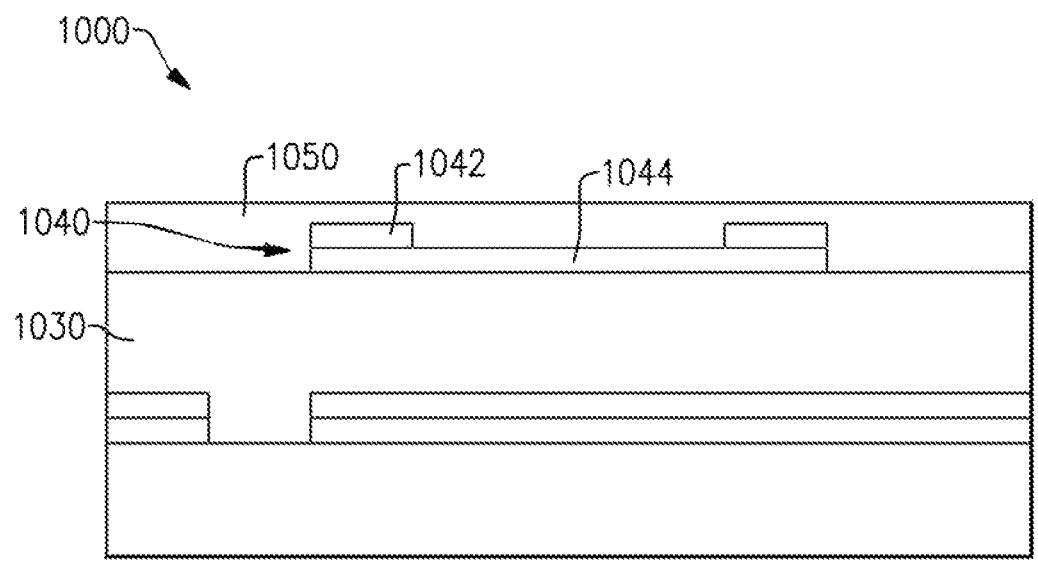
FIG. 10 illustrates a cross section of another embodiment of a surface acoustic wave resonator in which a velocity reduction cover is located above a temperature compensation layer.

In some embodiments, the spacing between the velocity reduction cover can be altered by changing the position of the velocity reduction cover with respect to a temperature compensation layer. FIG. 10 illustrates a cross section of another embodiment of a surface acoustic wave resonator in which a velocity reduction cover is located above a temperature compensation layer. The SAW resonator 1000 is similar to the SAW resonator 200 of FIG. 2A, except that rather than being embedded between sections of a temperature compensation layer 1030, a velocity adjustment cover 1040 overlies the temperature compensation layer 1030. Sublayers 1044 and 1042 of the velocity adjustment cover 1040 are located between the underlying temperature compensation layer 1030 and a passivation layer 1050. Such a configuration increases the spacing between the velocity adjustment cover 1040 and an IDT electrode 1010.

Figure 11:
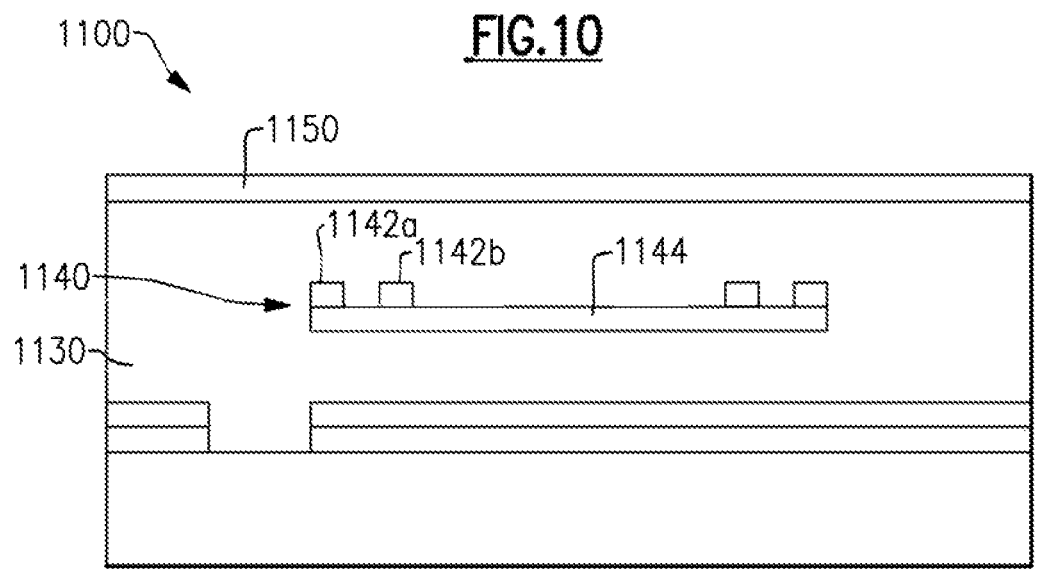
FIG. 11 illustrates a cross section of another embodiment of a surface acoustic wave resonator having a varying thickness within an edge region of a velocity reduction cover.

Although certain embodiments disclosed herein illustrate a velocity reduction cover in which most or all of the edge regions of the velocity reduction cover have a first thickness, and the central region of the velocity reduction cover have a second thickness which is thinner than the first thickness, a wide variety of alternative designs can have a similar impact on the SAW resonator performance. FIG. 11 illustrates a cross section of another embodiment of a surface acoustic wave resonator having a varying thickness within an edge component of a velocity reduction cover.

The SAW resonator 1100 of FIG. 11 is similar in structure to the SAW resonator 200 of FIG. 2A, except that the second sublayer of a velocity adjustment cover 1140 is not a single strip on either side of the velocity adjustment cover 1140, filling most or all of the edge regions of the velocity adjustment cover 1140. Instead, the second sublayer has been patterned to form an outer strip 1142*a* at least partially separated from an interior strip 1142*b* within one each of the edge portions of the velocity adjustment cover 1140. In some embodiments, the two strips 1142*a* and 1142*b* may be separated from one another along the length of the velocity adjustment cover 1140. In other embodiments, a gap between the two strips 1142*a* and 1142*b* may extend along only a portion of the length of the velocity adjustment cover 1140.

In the illustrated embodiment, the two strips 1142*a* and 1142*b* are similar in width to one another. In other embodiments, the two strips 1142*a* and 1142*b* may be of different widths. In the illustrated embodiment, the two strips 1142*a* and 1142*b* are located near the respective inner and outer edges of the edge region. In other embodiments, the two strips 1142*a* and 1142*b* may be asymmetrically positioned within the edge region of the velocity adjustment cover 1140. In some embodiments, the two strips 1142*a* and 1142*b* may be formed by forming and patterning a single sublayer, while in other embodiments, the two strips 1142*a* and 1142*b* may be formed separately from one another.

Figure 12:
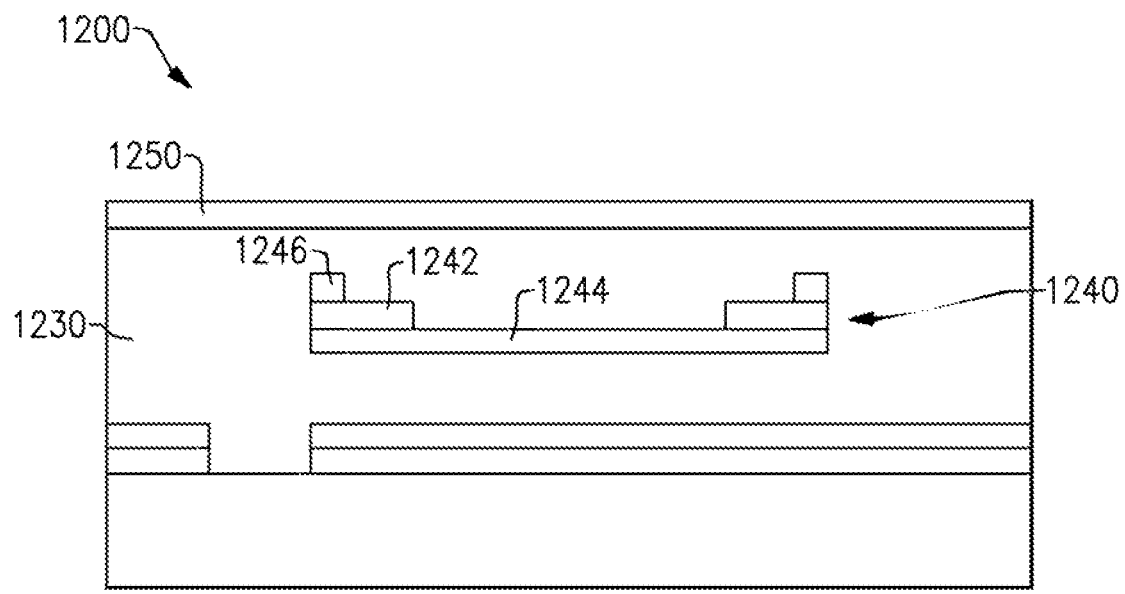
FIG. 12 illustrates a cross section of another embodiment of a surface acoustic wave resonator having a varying thickness within an edge region of a velocity reduction cover.

FIG. 12 illustrates a cross section of another embodiment of a surface acoustic wave resonator having a varying thickness within an edge component of a velocity reduction cover. The SAW resonator 1200 of FIG. 12 is similar in structure to the SAW resonator 200 of FIG. 2A, except that a velocity adjustment cover 1240 includes a third sublayer 1246 overlying a second sublayer 1242 and a first sublayer 1244. In the illustrated embodiment, the third sublayer 1246 is located on the outward side of the edge region of the velocity adjustment cover 1240. In other embodiments, however, the third sublayer 1246 may be more centrally positioned over the second sublayer 1242 within the edge region of the velocity adjustment cover 1240, or may be located along or closer to the interior side of the edge region of the velocity adjustment cover 1240. In addition, the relative widths of the third sublayer 1246 and the second sublayer 1242 may be different in other embodiments.

Figure 13:
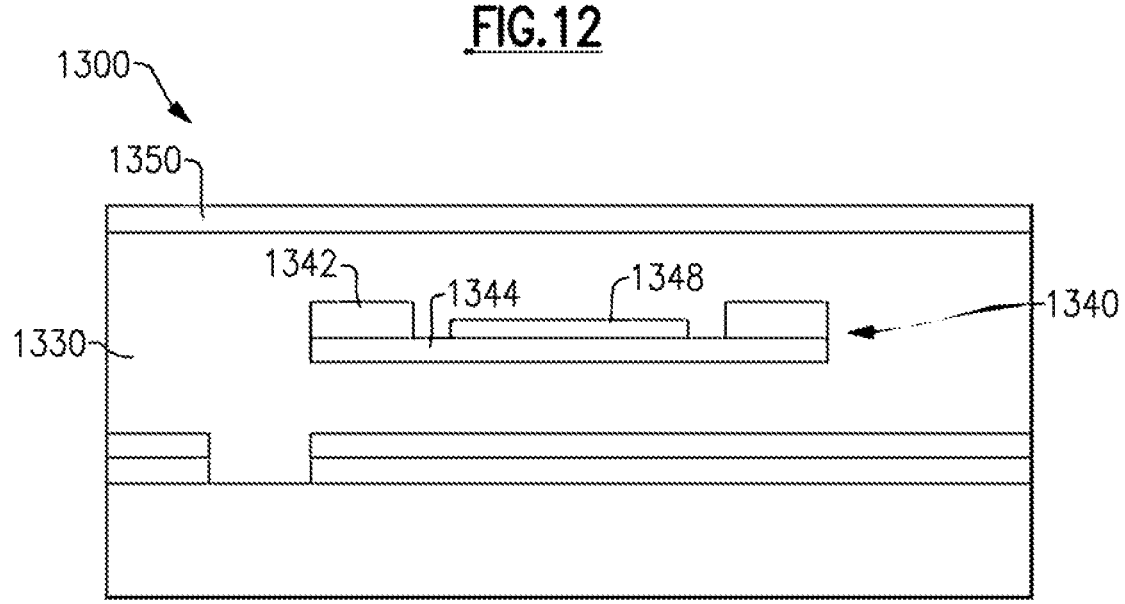
FIG. 13 illustrates a cross section of another embodiment of a surface acoustic wave resonator having a varying thickness across a width of a velocity reduction cover.

FIG. 13 illustrates a cross section of another embodiment of a surface acoustic wave resonator having a varying thickness across a width of a velocity reduction cover. The SAW resonator 1300 of FIG. 13 is similar in structure to the SAW resonator 200 of FIG. 2A, except that a velocity adjustment cover 1340 includes a third sublayer 1348 overlying a first sublayer 1344 within the central region of the velocity adjustment cover 1340. In the illustrated embodiment, the thickness of the third sublayer 1348 is less than the thickness of the strips of a second sublayer 1342 located outward of the third sublayer 1348. Even if the third sublayer 1348 includes the same material as the second sublayer 1342, the relative thicknesses of the second and third sublayers will cause the velocity reduction cover 1340 to function similarly to the velocity reduction cover 240 of the SAW resonator 200 of FIG. 2A.

In some embodiments, the relative thicknesses of the second sublayer 1342 and the third sublayer 1348 may be varied, so long as the second sublayer 1342 is thicker than the third sublayer 1342 when the two sublayers include the same material. In some embodiments, the width of the second sublayer 1342 may be narrower than the illustrated embodiment, and in such an embodiment the third sublayer may extend closer to or into the edge regions of the velocity reduction cover 1340.

Figure 14:
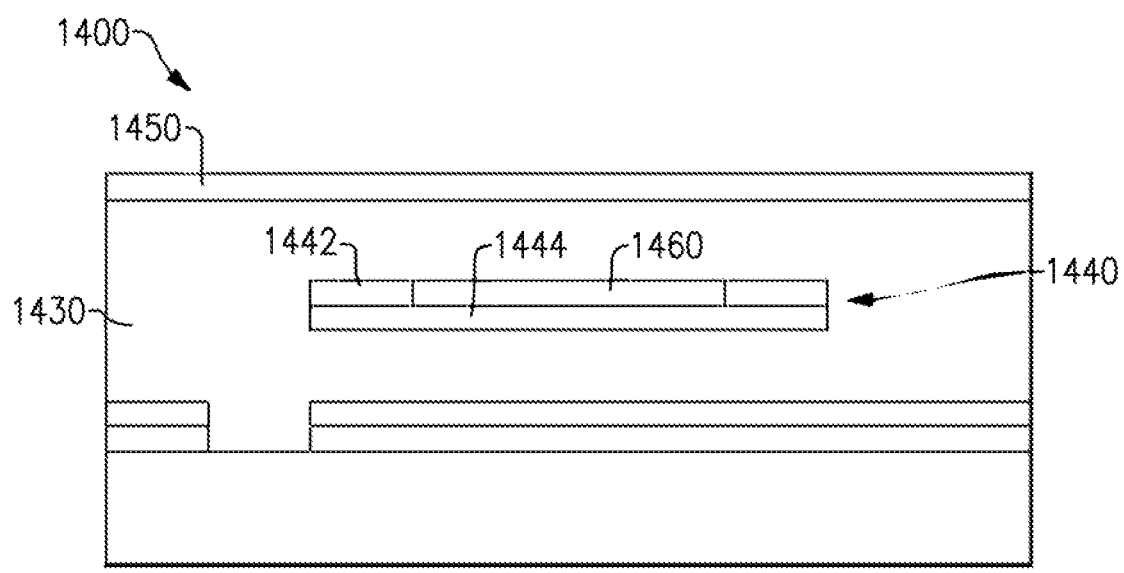
FIG. 14 illustrates a cross section of another embodiment of a surface acoustic wave resonator having a varying composition across a width of a velocity reduction cover.

FIG. 14 illustrates a cross section of another embodiment of a surface acoustic wave resonator having a varying composition across a width of a velocity reduction cover. The SAW resonator 1400 of FIG. 14 is similar in structure to the SAW resonator 1300 of FIG. 13, except that a velocity adjustment cover 1440 includes a third sublayer 1460 over a first sublayer 1444 within the central region of the velocity adjustment cover 1440 which is of a thickness similar to or identical to a second sublayer 1442. In contrast to the design of the SAW resonator 1300 of FIG. 13, which can use different thicknesses of the same material as the upper sublayers, the velocity adjustment cover 1440 can achieve the desired performance adjustment by utilizing different materials for the second sublayer 1442 and the third sublayer 1460, where the material of the second sublayer 1442 has a first density which is greater than a second density of the material of the third sublayer 1460.

In other embodiments, the thicknesses of the second sublayer 1442 and the third sublayer 1460 may be different. In some embodiments, the third sublayer 1460 may be thinner than the second sublayer 1442. In some embodiments, the third layer may be thicker than the second sublayer 1442, depending on the relative densities of the materials of the second sublayer 1442 and the third sublayer 1460.

Figure 15:
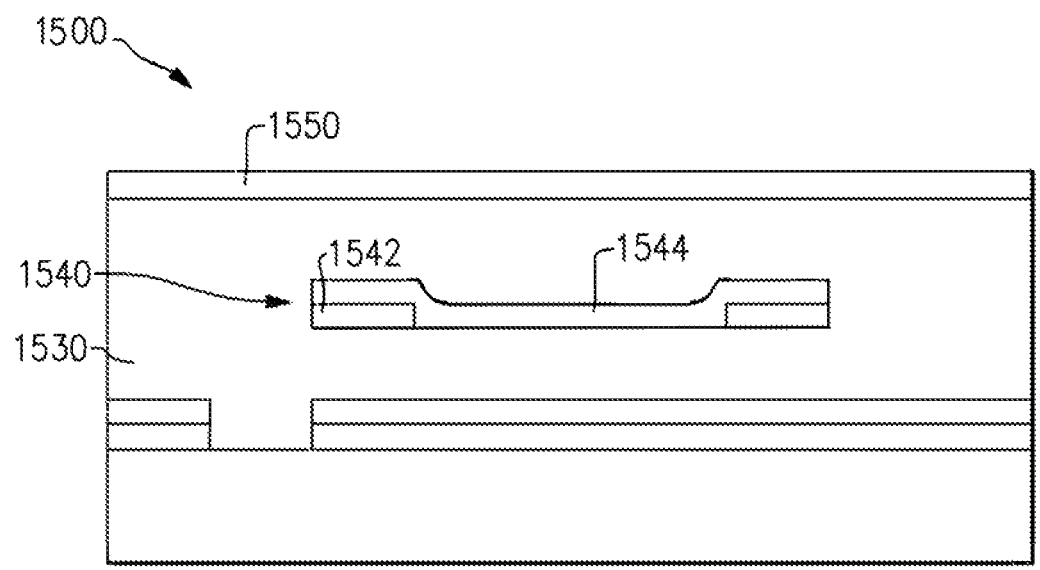
FIG. 15 illustrates a cross section of another embodiment of a surface acoustic wave resonator in which an upper sublayer of a velocity reduction cover is formed over a patterned lower sublayer of the velocity reduction cover.

In certain embodiments illustrated herein, the velocity reduction covers are illustrated with a lower sublayer extending across the entire width of the velocity reduction cover, and one or more patterned layers overlying the lower sublayer to define the desired shape for the velocity reduction cover. However, in other embodiments, the lower sublayer may be patterned, and an upper sublayer extending across the entire width of the velocity reduction cover may be formed over the patterned lower sublayer. FIG. 15 illustrates a cross section of another embodiment of a surface acoustic wave resonator in which an upper sublayer of a velocity reduction cover is formed over a patterned lower sublayer of the velocity reduction cover. In the SAW resonator 1500, a lower sublayer 1542 has been patterned to form two strips, one within each of the edge regions of a velocity reduction cover 1540. An upper sublayer 1544 has been formed over the patterned lower sublayer 1542. In the illustrated embodiment, the upper sublayer 1544 is conformal over the shape of the patterned lower sublayer 1542. Such a variation on the order of formation of the sublayers of a velocity reduction cover may be used in conjunction with any suitable velocity reduction cover design described herein.

Figure 16:
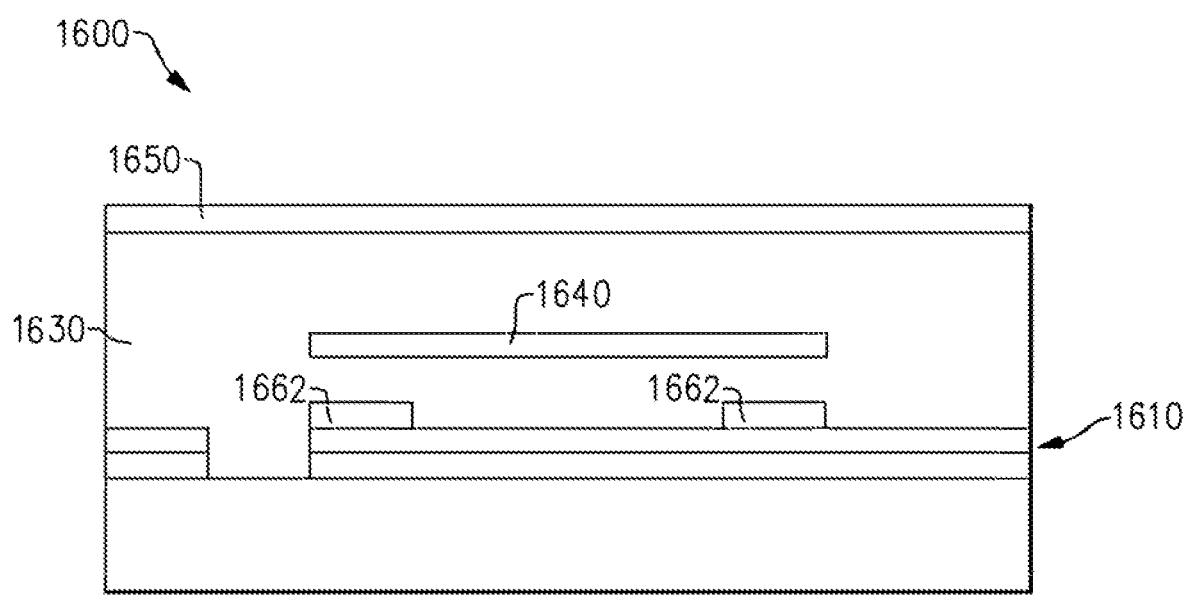
FIG. 16 illustrates a cross section of another embodiment of a surface acoustic wave resonator in which a portion of a velocity reduction structure is in contact with an interdigital transducer electrode.

In certain embodiments described herein, the sublayers of a velocity reduction cover are illustrated as being in contact with one another. However, in some other embodiments, such as those shown in FIGS. 2C, 2D, and 16, the sublayers may be spaced apart from one another and still provide a desired effect on the performance of a resonator. FIG. 16 illustrates a cross section of another embodiment of a surface acoustic wave resonator in which a portion of a velocity reduction structure is in contact with an interdigital transducer electrode. The SAW resonator 1600 of FIG. 16 is similar to the SAW resonator 200 of FIG. 2A, but differs in that a velocity reduction cover 1640 of the SAW resonator 1600 is a single layer of constant thickness, and the SAW resonator 1600 additionally includes a separate velocity adjustment structure which is not in direct contact with the velocity reduction cover 1640. In the illustrated embodiment, the SAW resonator 1600 additionally includes strips 1662 directly overlying the edge portions of an IDT electrode 1610, such that a portion of a temperature compensation layer 1630 extends between the velocity reduction cover 1640 and the strips 1662. The strips 1662 may be formed from the same material as the velocity reduction cover 1640, or may be formed from another material which has a density higher than that of the temperature compensation layer 1630.

In some other embodiments, an additional velocity adjustment structure such as strips 1662 may be spaced apart from both the velocity reduction cover 1640 and the IDT electrode 1610 by portions of the temperature compensation layer 1630. In other embodiments, the strips 1662 may be located above the velocity reduction cover 1640 and spaced apart from the velocity reduction cover 1640 by a portion of the temperature compensation layer 1630. In some embodiments, the higher of the velocity reduction cover 1640 or the strips 1662 may overlie the temperature compensation layer 1630, rather than being located within the temperature compensation layer 1630.

Figure 17A:
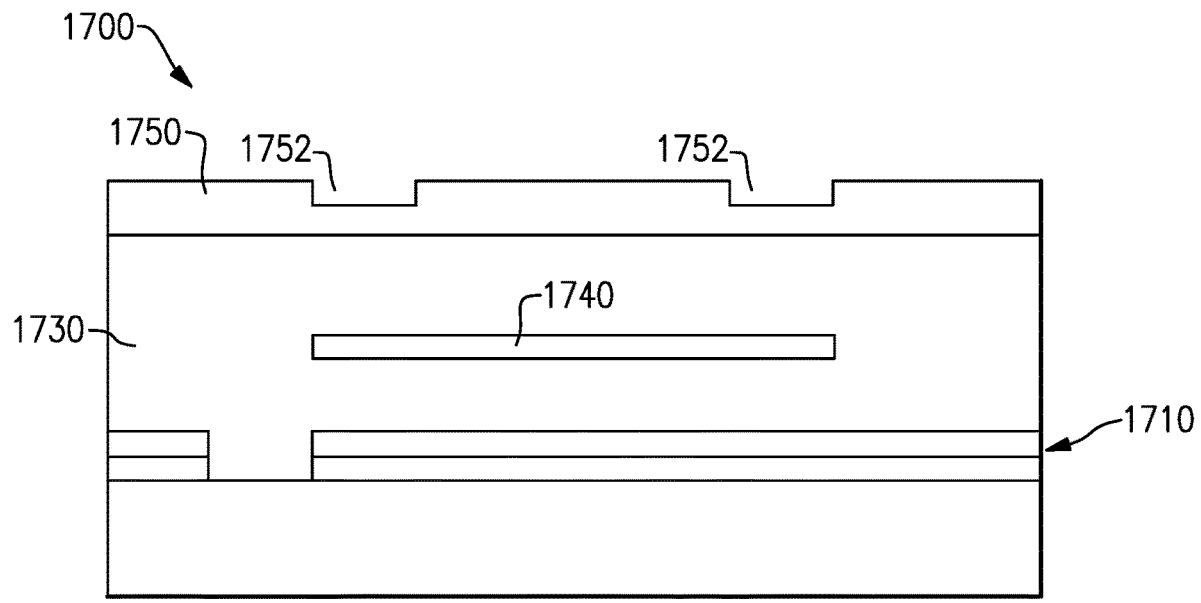
FIG. 17A illustrates a cross section of another embodiment of a surface acoustic wave resonator in which a passivation layer is thinner in an edge region of the surface acoustic wave resonator.

In some embodiments, a velocity reduction cover may have a substantially constant thickness across its width, and the variation in the density of the layers overlying the IDT electrodes may be provided through modification of a different layer. FIG. 17A illustrates a cross section of another embodiment of a surface acoustic wave resonator in which a passivation layer is thinner in an edge region of the surface acoustic wave resonator. The SAW resonator 1700 of FIG. 17A is similar to the SAW resonator 1600 of FIG. 16, but differs in that the SAW resonator 1700 does not include an additional high-density layer, but instead includes a patterned passivation layer 1750 in addition to a velocity reduction cover 1740 with a uniform width. In the illustrated embodiment, the passivation layer 1750 has been patterned to form thinner regions 1752 of the passivation layer 1750 in the portions of the passivation layer 1750 overlying the edge regions of the velocity reduction cover 1740. The passivation layer 1750 can include a material, such as silicon nitride, that increases acoustic velocity. Accordingly, the thinner regions 1752 in combination with the velocity reduction cover 1740 can provide a similar effect on the propagation of acoustic waves within the SAW resonator 1700 as described with respect to the other resonator designs described herein.

Figure 17B:
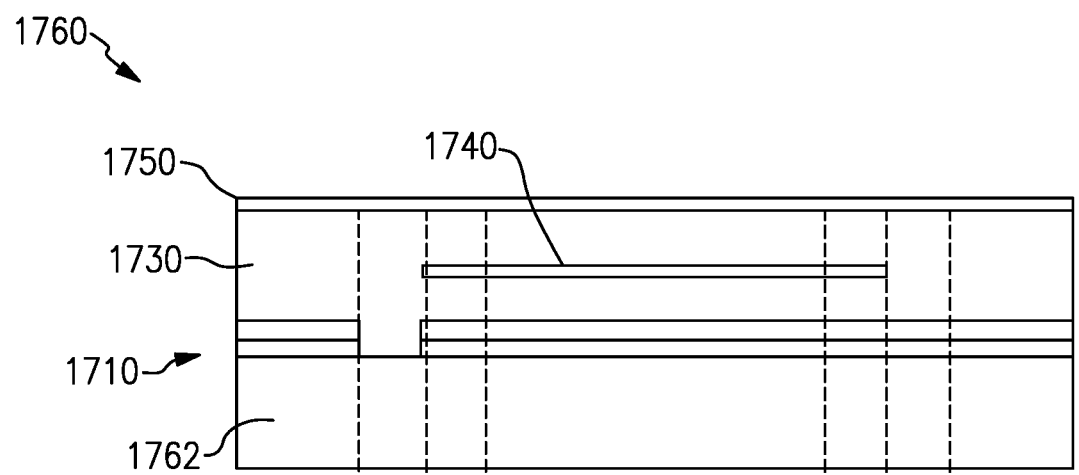
FIG. 17B is a schematic cross sectional view of a surface acoustic wave resonator according to another embodiment.
Figure 17C:
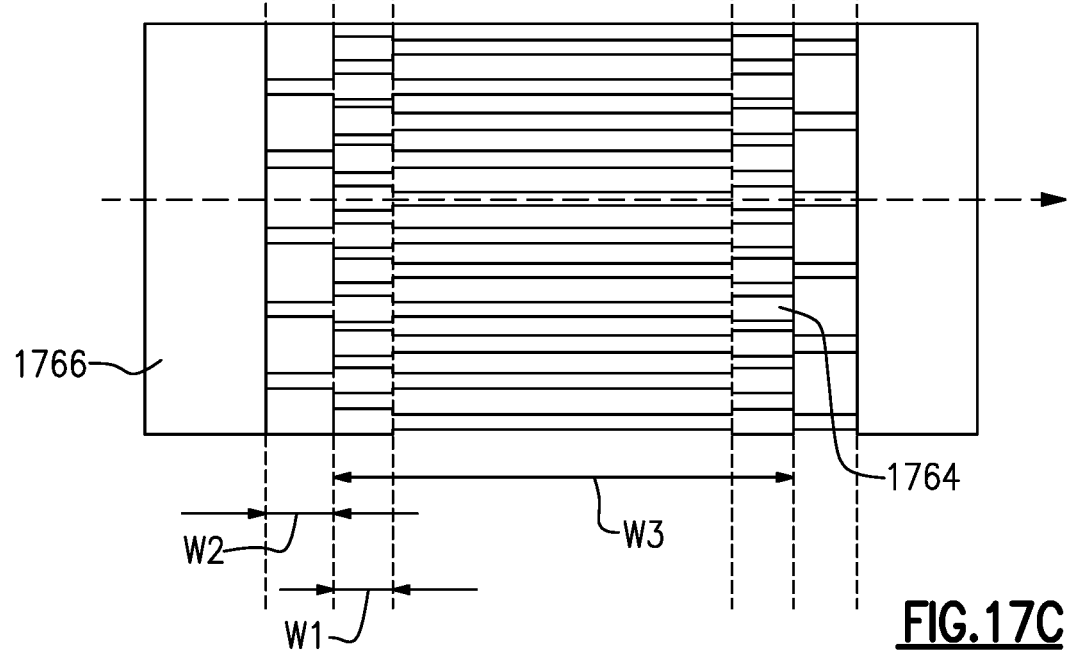
FIG. 17C is a schematic top plan view of the surface acoustic wave resonator of FIG. 17B.

FIG. 17B illustrates a cross section of a surface acoustic wave resonator 1760 according to another embodiment. FIG. 17C is a top plan view of the surface acoustic wave resonator 1760 illustrated in FIG. 17B. The surface acoustic wave resonator 1760 includes a piezoelectric layer 1762, a multilayer interdigital transducer electrode 1710, a temperature compensation layer 1730, a velocity reduction cover 1740, and a passivation layer 1750. Unless otherwise noted, components of the surface acoustic wave resonator 1760 may be the same or generally similar to like components of any surface acoustic wave resonator disclosed herein. The interdigital transducer electrode 1710 of the surface acoustic wave resonator 1760 can include a bus bar 1766, edge portions 1768, and a central region 1770. The interdigital transducer electrode 1710 can have a hammer head shape at or near the edge portions 1768. The hammer head shape can provide a velocity difference between the edge portions or border region and the central region of an active region of the interdigital transducer electrode 1710, thereby facilitating a piston mode operation.

Figures 17D, 17E:
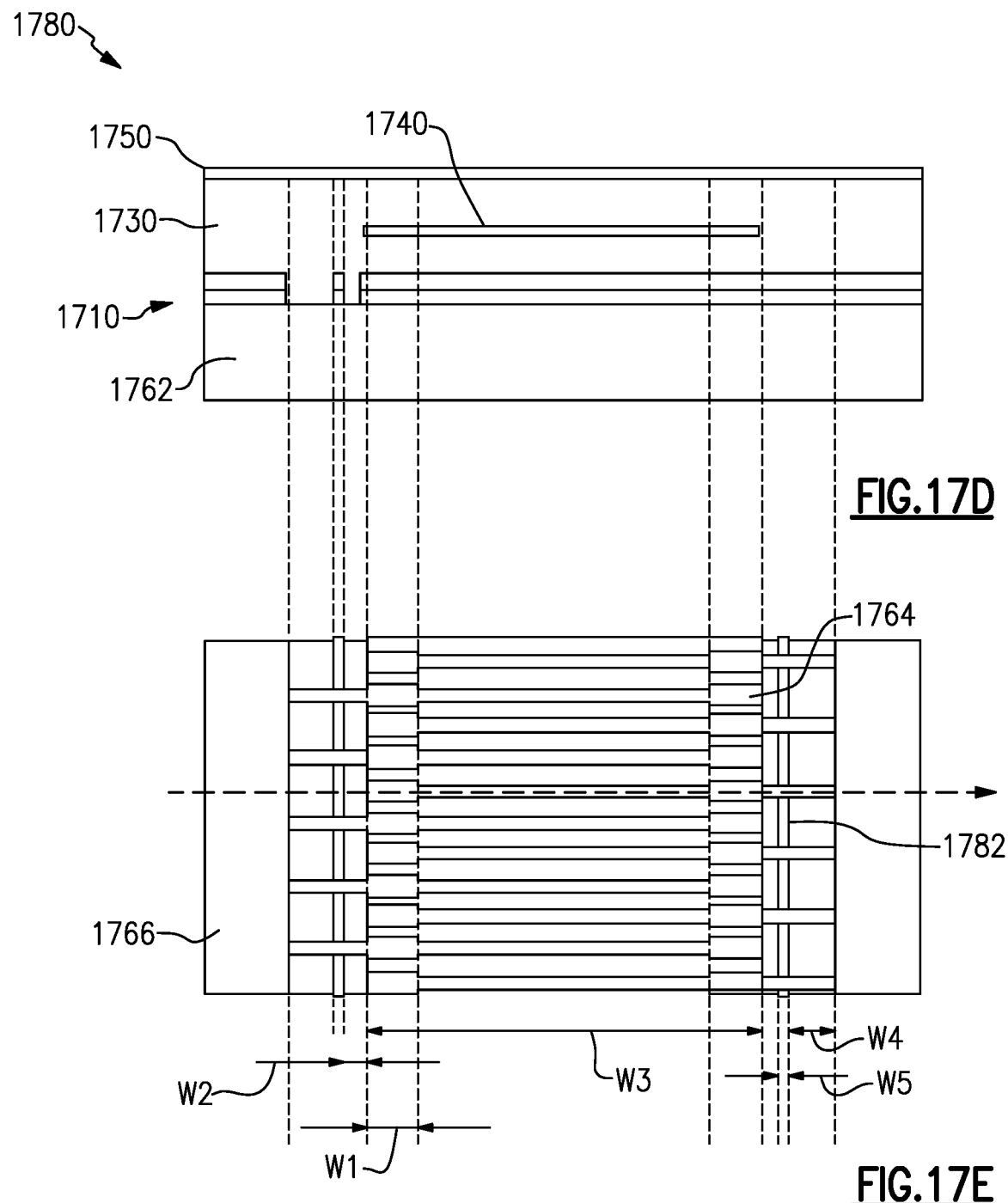
FIG. 17D is a schematic cross sectional view of a surface acoustic wave resonator according to another embodiment.
FIG. 17E is a schematic top plan view of the surface acoustic wave resonator of FIG. 17D.

FIG. 17D illustrates a cross section of a surface acoustic wave resonator 1780 according to another embodiment. FIG. 17E is a top plan view of the surface acoustic wave resonator 1760 illustrated in FIG. 17D. The surface acoustic wave resonator 1780 is generally similar to the surface acoustic wave resonator 1760 except the surface acoustic wave resonator 1780 also includes a mini bus bar 1782. The mini bus bar 1782 can be spaced apart from the bus bar 1766 by a gap. The mini bus bar 1782 can provide a velocity difference between a border region and a central part of the active region of the interdigital transducer electrode 1710, thereby facilitating a piston mode operation.

The gap between the mini bus bar 1782 and the bus bar 1766 has a width $W_4$. For example, the width $W_4$ can be in a range from $0.5\lambda$ to $3\lambda$, from $0.5\lambda$ to $2\lambda$, from $0.5\lambda$ to $1\lambda$, from $0.7\lambda$ to $3\lambda$, from $1\lambda$ to $3\lambda$, from $2\lambda$ to $3\lambda$, or $1\lambda$ to $2\lambda$. The mini bus bar 1782 has a width $W_5$. For example, the width $W_5$ of the mini bus bar 1782 can be in a range from $0.1\lambda$ to $0.4\lambda$, from $0.1\lambda$ to $0.3\lambda$, from $0.2\lambda$ to $0.4\lambda$, or from $0.2\lambda$ to $0.3\lambda$.

Figure 17F:
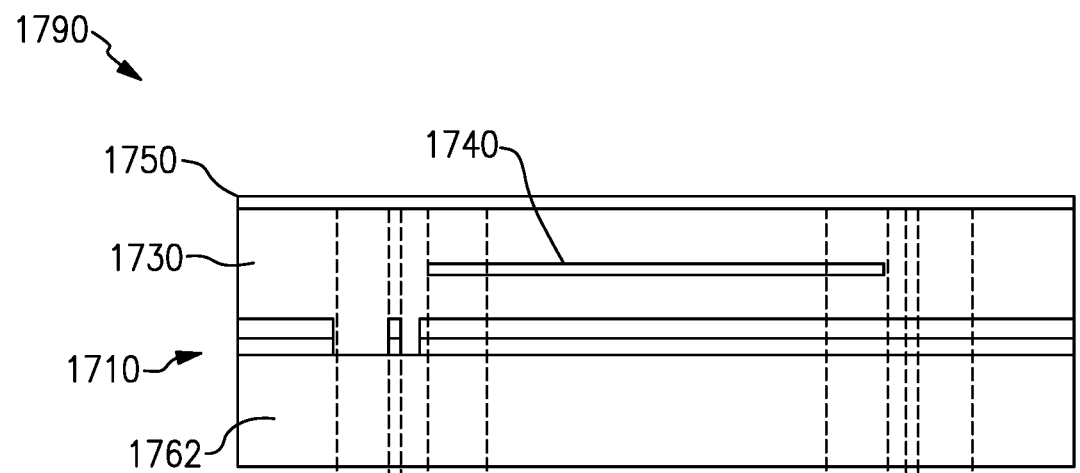
FIG. 17F is a schematic cross sectional view of a surface acoustic wave resonator according to another embodiment.
Figure 17G:
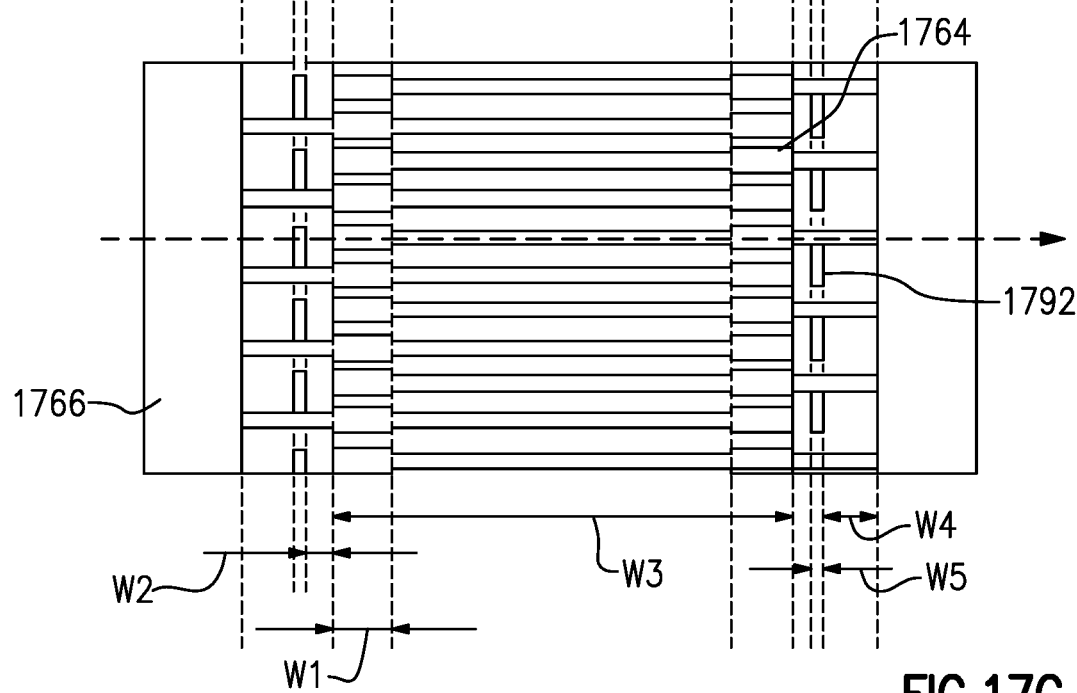
FIG. 17G is a schematic top plan view of the surface acoustic wave resonator of FIG. 17F.

FIG. 17F illustrates a cross section of a surface acoustic wave resonator 1790 according to another embodiment. FIG. 17G is a top plan view of the surface acoustic wave resonator 1790 illustrated in FIG. 17F. The surface acoustic wave resonator 1790 is generally similar to the surface acoustic wave resonator 1780 except the surface acoustic wave resonator 1780 includes a discontinuous mini bus bar 1792. The discontinuous mini bus bar 1792 can also be referred to as a gap hammer mini bus bar structure. The discontinuous mini bus bar 1792 can provide a velocity difference between a border region and a central part of the active region of the interdigital transducer electrode 1710, thereby facilitating a piston mode operation. In some embodiments, as compared to the mini bus bar 1782 of the surface acoustic wave resonator 1780 illustrated in FIG. 17E, the discontinuous mini bus bar 1792 can provide less velocity difference between the border region and the central part of the active region, which may be beneficial in certain applications.

Figure 18A:
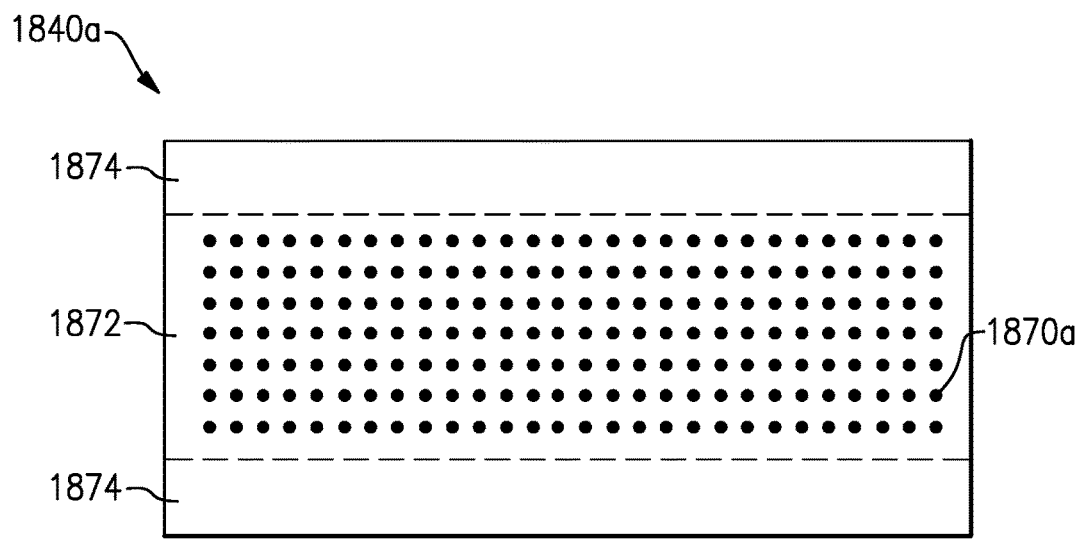
FIG. 18A is a top plan view illustrating a section of a patterned velocity adjustment cover in which portions of the velocity adjustment layer have been selectively removed or reduced in thickness.

In some of the embodiments illustrated herein, the velocity reduction covers or other structures may have substantially constant cross-sectional shapes over the length of the velocity reduction cover. However, in some other embodiments, the shape or pattern of the velocity reduction cover may vary over the length of the velocity reduction cover in order to provide a desired effect on the operation of the SAW resonator. FIG. 18A is a top plan view illustrating a section of a patterned velocity reduction cover in which portions of the velocity adjustment layer have been selectively removed or reduced in thickness. As illustrated, a velocity reduction cover 1840*a* has been patterned to include a plurality of apertures 1870*a* in the velocity reduction cover 1840*a*. In some embodiments, such as the illustrated embodiment, the apertures 1870*a* may be concentrated within a central region 1872 of the velocity reduction cover 1840*a*, to provide an increased overall density of the velocity reduction cover 1840*a* in the edge regions of the velocity reduction cover 1840*a*.

Figure 18B:
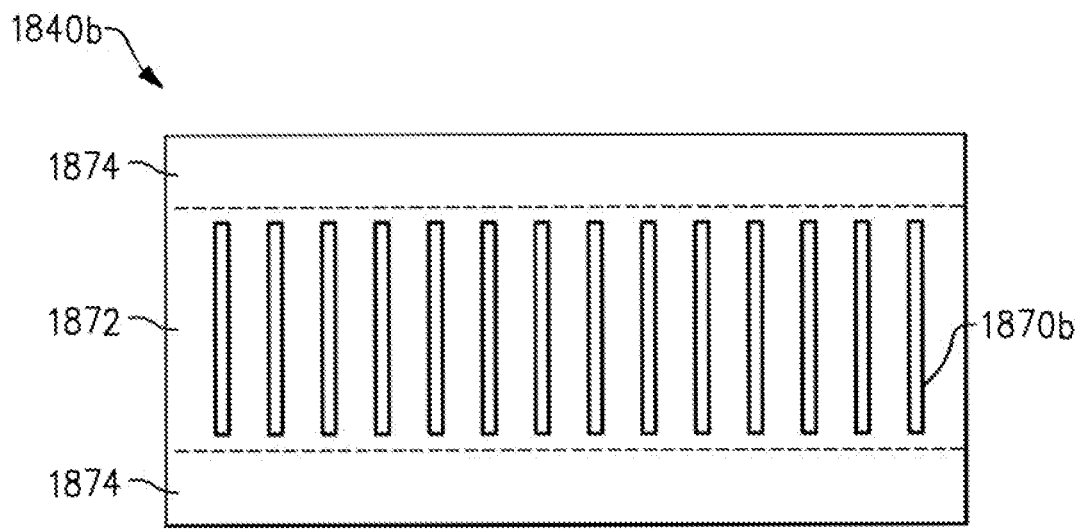
FIG. 18B is a top plan view illustrating a section of another embodiment of a patterned velocity adjustment cover in which portions of the velocity adjustment layer have been selectively removed or reduced in thickness.
Figure 18C:
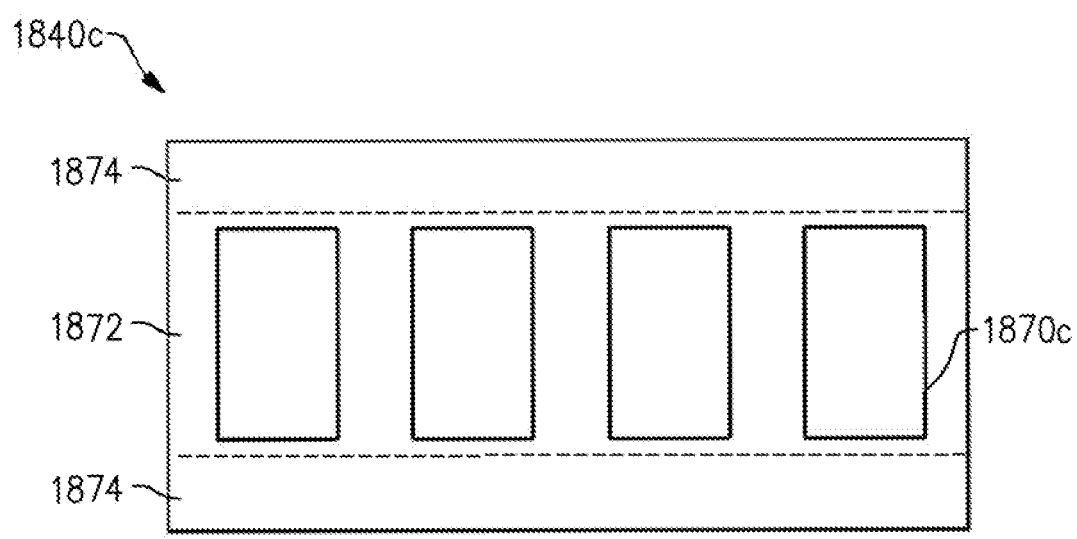
FIG. 18C is a top plan view illustrating a section of a patterned velocity adjustment cover in which portions of the velocity adjustment layer have been selectively removed or reduced in thickness.

FIG. 18B is a top plan view illustrating a section of another embodiment of a patterned velocity adjustment cover in which portions of the velocity adjustment layer have been selectively removed or reduced in thickness. In the embodiment of FIG. 18B, apertures 1870*b* in a velocity reduction cover 1840*b* are strips which extend across only a central portion of the velocity reduction cover 1840*b*. FIG. 18C is a top plan view illustrating a section of a patterned velocity adjustment cover in which portions of the velocity adjustment layer have been selectively removed or reduced in thickness. In the embodiment of FIG. 18C, apertures 1870*c* in a velocity reduction cover 1840*c* are longer rectangular apertures 1870*c* which again extend across only a central portion of the velocity reduction cover 1840*c*.

Such selective patterning of a velocity reduction cover can also be done in conjunction with the sublayer arrangements of the various embodiments described herein. In some embodiments, the size and/or density of the apertures may increase in the central region of the velocity reduction cover. In some embodiments, the velocity reduction cover sections may not be patterned to form apertures extending all the way through the velocity reduction cover, but may instead form depressions extending into but not through the velocity reduction cover. In some embodiments, the depth of the depressions in the velocity reduction cover may be deeper near the central region of the velocity reduction cover. A wide variety of other combinations and modifications to the exemplary designs described herein may also be used.

Figure 19:
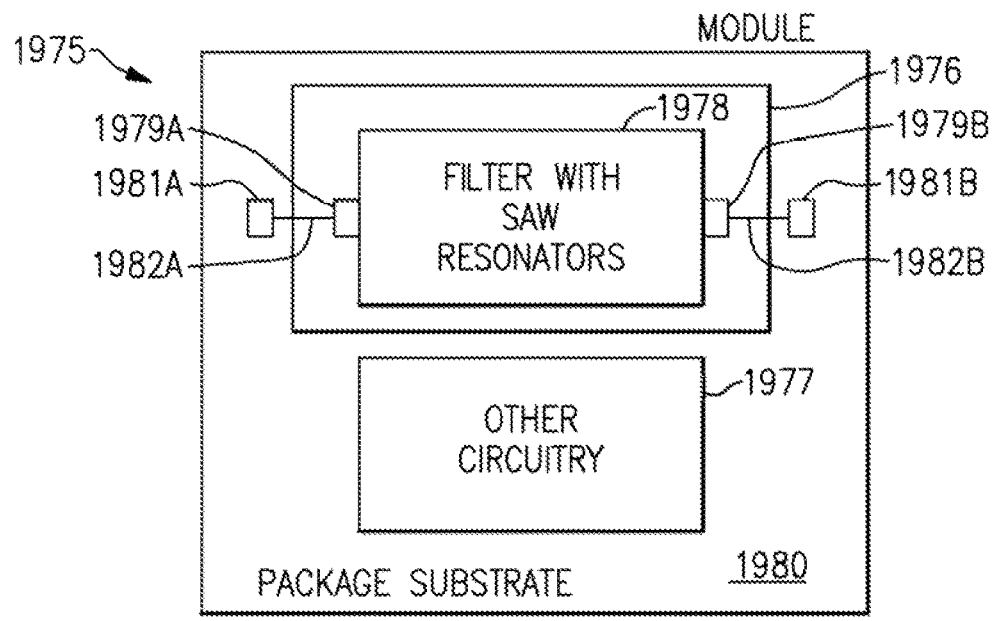
FIG. 19 is a schematic diagram of a radio frequency module that includes a surface acoustic wave component according to an embodiment.

FIG. 19 is a schematic diagram of a radio frequency module 1975 that includes a surface acoustic wave component 1976 according to an embodiment. The illustrated radio frequency module 1975 includes the SAW component 1976 and other circuitry 1977. The SAW component 1976 can include one or more SAW resonators with any suitable combination of features of the SAW resonators disclosed herein. The SAW component 1976 can include a SAW die that includes SAW resonators. The SAW die can also include one or more MMS filters. Some or all of the SAW resonators on the SAW die can include a velocity reduction cover or another velocity adjustment structure.

The SAW component 1976 shown in FIG. 10 includes a filter 1978 and terminals 1979A and 1979B. The filter 1978 includes SAW resonators. One or more of the SAW resonators can be SAW resonators including a velocity reduction cover in accordance with any suitable principles and advantages disclosed herein. The terminals 1979A and 1978B can serve, for example, as an input contact and an output contact. The SAW component 1976 and the other circuitry 1977 are on or supported by a common packaging substrate 1980 in FIG. 19. The package substrate 1980 can be a laminate substrate. The terminals 1979A and 1979B can be electrically connected to contacts 1981A and 1981B, respectively, on or supported by the packaging substrate 1980 by way of electrical connectors 1982A and 1982B, respectively. The electrical connectors 1082A and 1082B can be bumps or wire bonds, for example. The other circuitry 1977 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1975 can include one or more packaging structures to, for example, provide protection and/or facilitate easier handling of the radio frequency module 1975. Such a packaging structure can include an overmold structure formed over the packaging substrate 1980. The overmold structure can encapsulate some or all of the components of the radio frequency module 1975.

Figure 20:
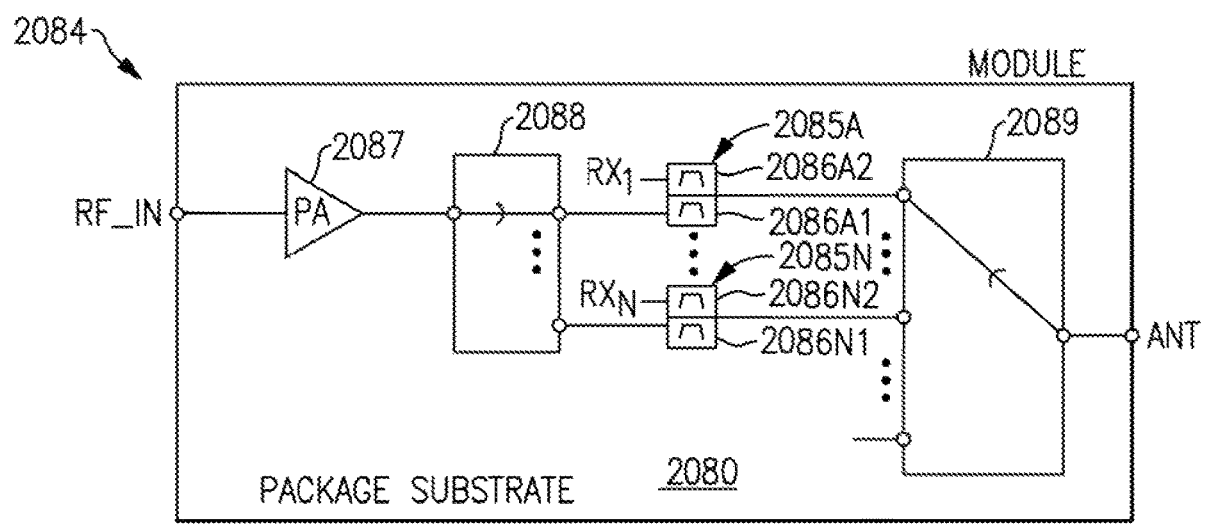
FIG. 20 is a schematic diagram of a radio frequency module that includes duplexers with surface acoustic wave resonators according to an embodiment.

FIG. 20 is a schematic diagram of a radio frequency module 2084 that includes a surface acoustic wave component according to an embodiment. As illustrated, the radio frequency module 2084 includes duplexers 2085A to 2085N that include respective transmit filters 2086A1 to 2086N1 and respective receive filters 2086A2 to 2086N2, a power amplifier 2087, a select switch 2088, and an antenna switch 2089. The radio frequency module 2084 can include a package that encloses the illustrated elements. The illustrated elements can be disposed on a common packaging substrate 2080. The packaging substrate can be a laminate substrate, for example.

The duplexers 2085A to 2085N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 2086A1 to 2086N1 can include one or more SAW resonators in accordance with any suitable principles and advantages disclosed herein. Similarly, one or more of the receive filters 2086A2 to 2086N2 can include one or more SAW resonators in accordance with any suitable principles and advantages disclosed herein. In certain embodiments, one or more of the receive filters 2086A2 to 2086N2 can include one or more SAW resonators with a velocity reduction cover and an MMS filter free from the velocity reduction cover. Although FIG. 20 illustrates duplexers, any suitable principles and advantages disclosed herein can be implemented in other multiplexers (e.g., quadplexers, hexaplexers, octoplexers, etc.) and/or in switch-plexers.

The power amplifier 2087 can amplify a radio frequency signal. The illustrated switch 2088 is a multi-throw radio frequency switch. The switch 2088 can electrically couple an output of the power amplifier 2087 to a selected transmit filter of the transmit filters 2086A1 to 2086N1. In some instances, the switch 2088 can electrically connect the output of the power amplifier 2087 to more than one of the transmit filters 2086A1 to 2086N1. The antenna switch 2089 can selectively couple a signal from one or more of the duplexers 2085A to 2085N to an antenna port ANT. The duplexers 2085A to 2085N can be associated with different frequency bands and/or different modes of operation (e.g., different power modes, different signaling modes, etc.).

Figure 21:
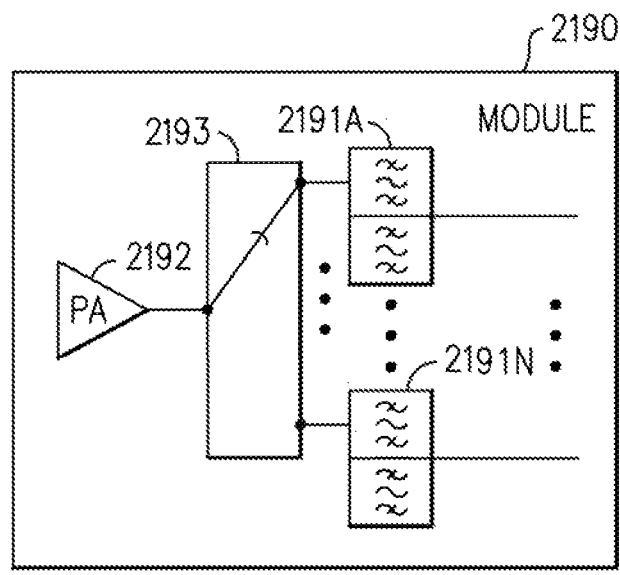
FIG. 21 is a schematic block diagram of a module that includes a power amplifier, a radio frequency switch, and duplexers that include one or more surface acoustic wave resonators according to an embodiment.

FIG. 21 is a schematic block diagram of a module 2190 that includes a power amplifier 2192, a radio frequency switch 2193, and duplexers 2191A to 1291N in accordance with one or more embodiments. The power amplifier 2192 can amplify a radio frequency signal. The radio frequency switch 2193 can be a multi-throw radio frequency switch. The radio frequency switch 2193 can electrically couple an output of the power amplifier 2192 to a selected transmit filter of the duplexers 2191A to 2191N. One or more filters of the duplexers 2191A to 2191N can include any suitable number of surface acoustic wave resonators which include a velocity reduction cover, in accordance with any suitable principles and advantages discussed herein. In certain embodiments, one or more filters of the duplexers 2191A to 2191N can include one or more SAW resonators with a velocity reduction cover and an MMS filter free from the velocity reduction cover. Any suitable number of duplexers 2191A to 2191N can be implemented.

Figure 22:
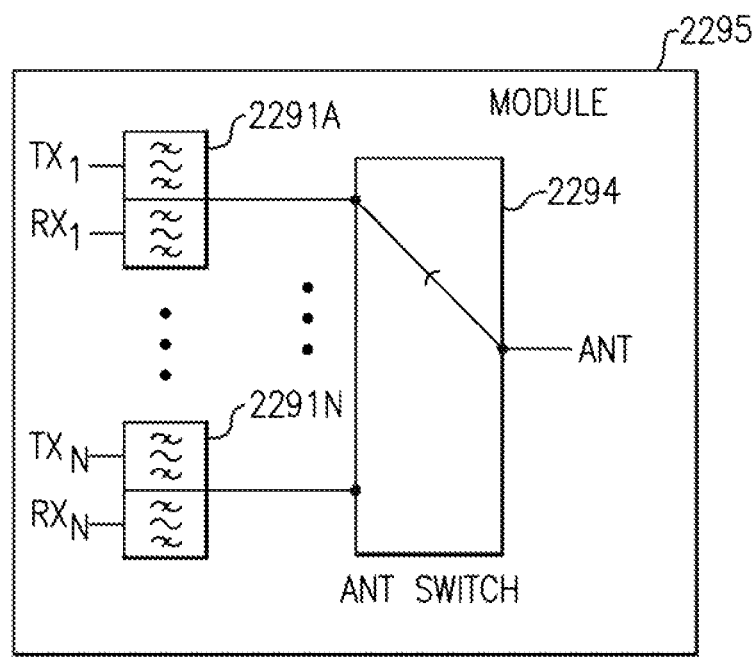
FIG. 22 is a schematic block diagram of a module that includes an antenna switch and duplexers that include one or more surface acoustic wave resonators according to an embodiment.

FIG. 22 is a schematic block diagram of a module 2295 that includes duplexers 2291A to 2291N and an antenna switch 2294. One or more filters of the duplexers 2291A to 2291N can include any suitable number of surface acoustic wave resonators which include a velocity reduction cover, in accordance with any suitable principles and advantages discussed herein. Any suitable number of duplexers 2291A to 2291N can be implemented. The antenna switch 2294 can have a number of throws corresponding to the number of duplexers 2291A to 2291N. The antenna switch 2294 can electrically couple a selected duplexer to an antenna port of the module 2295.

Figure 23:
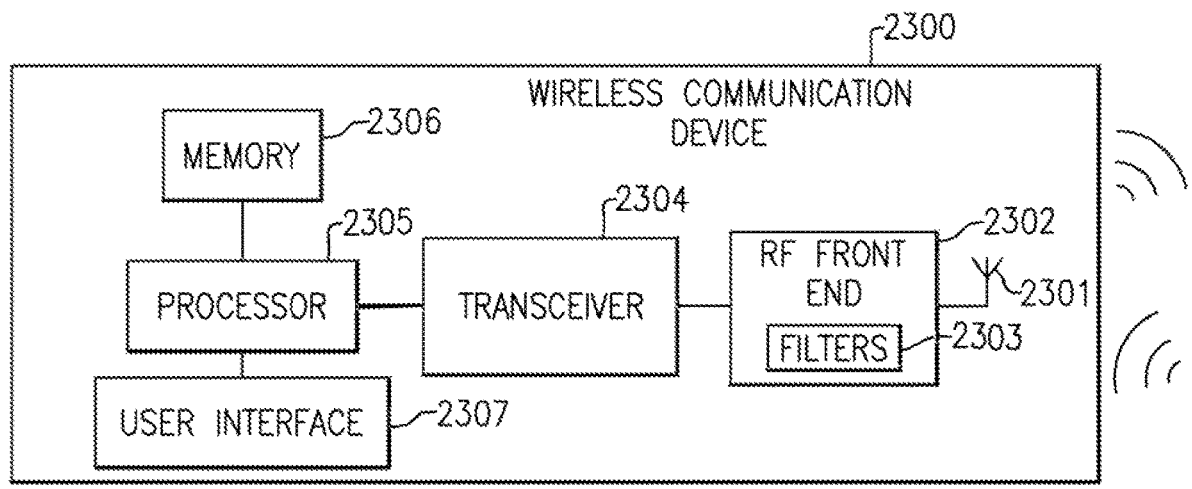
FIG. 23 is a schematic block diagram of a wireless communication device that includes a filter in accordance with one or more embodiments.

FIG. 23 is a schematic diagram of a wireless communication device 2300 that includes filters 2303 in a radio frequency front end 2302 according to an embodiment. The filters 2303 can include one or more SAW resonators in accordance with any suitable principles and advantages discussed herein. The wireless communication device 2300 can be any suitable wireless communication device. For instance, a wireless communication device 2300 can be a mobile phone, such as a smart phone. As illustrated, the wireless communication device 2300 includes an antenna 2301, an RF front end 2302, a transceiver 2304, a processor 2305, a memory 2306, and a user interface 2307. The antenna 2301 can transmit RF signals provided by the RF front end 2302. Such RF signals can include carrier aggregation signals. Although not illustrated, the wireless communication device 2300 can include a microphone and a speaker in certain applications.

The RF front end 2302 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 2302 can transmit and receive RF signals associated with any suitable communication standards. The filters 2303 can include SAW resonators of a SAW component that includes any suitable combination of features discussed with reference to any embodiments discussed above.

The transceiver 2304 can provide RF signals to the RF front end 2302 for amplification and/or other processing. The transceiver 2304 can also process an RF signal provided by a low noise amplifier of the RF front end 2302. The transceiver 2304 is in communication with the processor 2305. The processor 2305 can be a baseband processor. The processor 2305 can provide any suitable base band processing functions for the wireless communication device 2300. The memory 2306 can be accessed by the processor 2305. The memory 2306 can store any suitable data for the wireless communication device 2300. The user interface 2307 can be any suitable user interface, such as a display with touch screen capabilities.

Figure 24:
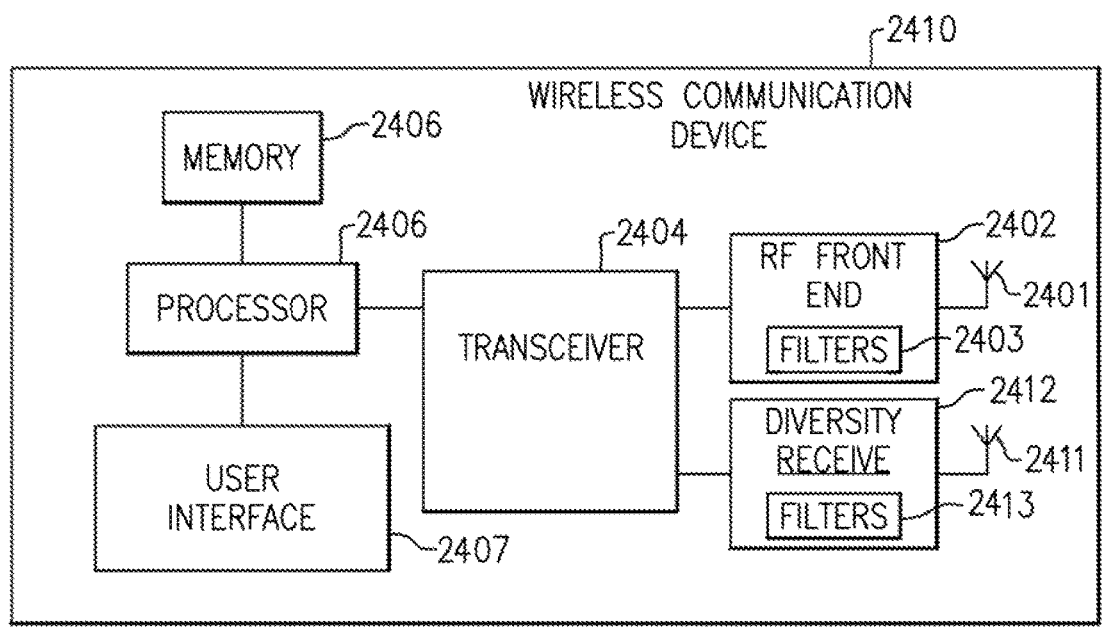
FIG. 24 is a schematic block diagram of another wireless communication device that includes a filter in accordance with one or more embodiments.

FIG. 24 is a schematic diagram of a wireless communication device 2410 that includes filters 2403 in a radio frequency front end 2402 and second filters 2413 in a diversity receive module 2412. The wireless communication device 2410 is like the wireless communication device 2300 of FIG. 23, except that the wireless communication device 2420 also includes diversity receive features. As illustrated in FIG. 24, the wireless communication device 2420 includes a diversity antenna 2411, a diversity module 2412 configured to process signals received by the diversity antenna 2411 and including filters 2413, and a transceiver 2404 in communication with both the radio frequency front end 1502 and the diversity receive module 2412. The filters 2413 can include one or more SAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave filter configured to filter a radio frequency signal, the surface acoustic wave filter comprising:
   a first surface acoustic wave device including an interdigital transducer electrode, a first portion of a temperature compensation layer, and a velocity reduction cover spaced apart from the interdigital transducer electrode by at least a portion of the first portion of the temperature compensation layer, a density of the velocity reduction cover being higher than a density of the temperature compensation layer; and
   a second surface acoustic wave device including a second portion of the temperature compensation layer, the second portion of the temperature compensation layer being free from any velocity reduction cover having a higher density than the density of the temperature compensation layer, the second surface acoustic wave device being a multi-mode surface acoustic wave filter.

2. The surface acoustic wave filter of claim 1 wherein the first surface acoustic wave device is formed on a first wafer and the second surface acoustic wave device is formed on a second wafer different from the first wafer.

3. The surface acoustic wave filter of claim 1 wherein the velocity reduction cover includes first and second edge regions on either side of a central region, the velocity reduction cover is thicker in the first and second edge regions than in the central region.

4. The surface acoustic wave filter of claim 3 wherein the interdigital transducer electrode includes a bus bar and fingers extending from the bus bar and wherein the first and second edge regions extend generally perpendicular to the fingers of the interdigital transducer electrode.

5. The surface acoustic wave filter of claim 4 wherein the velocity reduction cover includes a first sublayer extending through at least part of the central region and the first and second edge regions of the velocity reduction cover and a second sublayer extending parallel to the first sublayer and located only within at least one of the first and second edge regions of the velocity reduction cover.

6. The surface acoustic wave filter of claim 5 wherein the second sublayer includes a first strip within the first edge region of the velocity reduction cover and extending perpendicular to the fingers of the interdigital transducer electrode and a second strip within the second edge region of the velocity reduction cover and extending perpendicular to the fingers of the interdigital transducer electrode.

7. The surface acoustic wave filter of claim 1 wherein the velocity reduction cover is spaced apart from the interdigital transducer electrode by a distance of 40 nanometers or more.

8. The surface acoustic wave filter of claim 1 wherein the velocity reduction cover includes at least one of tungsten, molybdenum, platinum, gold, iridium, ruthenium, titanium, copper, or tantalum.

9. The surface acoustic wave filter of claim 1 wherein the velocity reduction cover includes a non-conductive material.

10. The surface acoustic wave filter of claim 1 further comprising a third surface acoustic wave device, the third surface acoustic wave device including a second interdigital transducer electrode and a second velocity reduction cover spaced apart from one another by at least a portion of the temperature compensation layer, a density of the second velocity reduction cover being higher than a density of the temperature compensation layer.

11. A surface acoustic wave filter comprising:
a velocity-adjusted resonator including an interdigital transducer electrode, a first portion of a temperature compensation layer, and a velocity reduction cover spaced apart from the interdigital transducer electrode by the first portion of the temperature compensation layer, the velocity reduction cover including first and second edge regions on either side of a central region and being thicker in the first and second edge regions than in the central region, the velocity-adjusted resonator being formed on a first wafer;
a surface acoustic wave resonator including a second interdigital transducer electrode and a second portion of the temperature compensation layer over the second interdigital transducer electrode, the second portion of the temperature compensation layer being free from a velocity reduction cover having a higher density than a density of the temperature compensation layer or including a velocity adjustment cover having a different structure from the velocity reduction cover of the velocity-adjusted resonator, the surface acoustic wave resonator being formed on the first wafer; and
one or more surface acoustic wave devices coupled to the velocity-adjusted resonator, the one or more surface acoustic wave devices and the velocity-adjusted resonator arranged to filter a radio frequency signal, at least one of the one or more surface acoustic wave devices being formed on a second wafer different from the first wafer.

12. The surface acoustic wave filter of claim 11 wherein a density of the velocity reduction cover is higher than a density of the temperature compensation layer.

13. The surface acoustic wave filter of claim 11 wherein the interdigital transducer electrode includes a bus bar and fingers extending from the bus bar and wherein the first and second edge regions extend generally perpendicular to the fingers of the interdigital transducer electrode.

14. The surface acoustic wave filter of claim 11 wherein the temperature compensation layer includes silicon dioxide.

15. The surface acoustic wave filter of claim 11 wherein the velocity reduction cover includes a non-conductive material.

16. The surface acoustic wave filter of claim 11 wherein the velocity reduction cover includes at least one of tungsten, molybdenum, platinum, gold, iridum, ruthenium, titanium, copper, tantalum, tantalum pentoxide, titanium oxide, or titanium nitride.

17. The surface acoustic wave filter of claim 11 wherein the velocity reduction cover includes a first sublayer extending through at least part of the central region and the first and second edge regions of the velocity reduction cover and a second sublayer extending parallel to the first sublayer and located only within at least one of the first and second edge regions of the velocity reduction cover.

18. The surface acoustic wave filter of claim 17 wherein the second sublayer includes a first strip within the first edge region of the velocity reduction cover and extending perpendicular to fingers of the interdigital transducer electrode and a second strip within the second edge region of the velocity reduction cover and extending perpendicular to the fingers of the interdigital transducer electrode.

19. The surface acoustic wave filter of claim 11 wherein the one or more surface acoustic wave devices include a second velocity-adjusted resonator, the second velocity-adjusted resonator including a second interdigital transducer electrode and a second velocity reduction cover spaced apart from one another by at least a portion of the temperature compensation layer, a density of the second velocity reduction cover being higher than a density of the temperature compensation layer.

20. The surface acoustic wave filter of claim 11 wherein each of the one or more surface acoustic wave devices is a velocity-adjusted resonator including an interdigital transducer electrode and a velocity reduction cover spaced apart from one another by at least a portion of the temperature compensation layer, a density of the velocity reduction cover being higher than a density of the temperature compensation layer.

* * * * *